(12) United States Patent
Chiang et al.

(10) Patent No.: US 10,879,130 B2
(45) Date of Patent: Dec. 29, 2020

(54) SEMICONDUCTOR DEVICE STRUCTURE WITH SEMICONDUCTOR WIRE

(71) Applicant: Taiwan Semiconductor Manufacturing Co., Ltd., Hsinchu (TW)

(72) Inventors: Hung-Li Chiang, Taipei (TW); I-Sheng Chen, Taipei (TW); Tzu-Chiang Chen, Hsinchu (TW); Tung-Ying Lee, Hsinchu (TW); Szu-Wei Huang, Hsinchu (TW); Huan-Sheng Wei, Taipei (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 16/408,877

(22) Filed: May 10, 2019

(65) Prior Publication Data

US 2019/0267292 A1 Aug. 29, 2019

Related U.S. Application Data

(62) Division of application No. 15/692,188, filed on Aug. 31, 2017, now Pat. No. 10,290,548.

(51) Int. Cl.
*H01L 21/8238* (2006.01)
*H01L 27/092* (2006.01)
(Continued)

(52) U.S. Cl.
CPC ........ *H01L 21/823807* (2013.01); *H01L 21/02603* (2013.01); *H01L 21/02609* (2013.01); *H01L 21/823814* (2013.01); *H01L 21/823828* (2013.01); *H01L 21/823878* (2013.01); *H01L 27/092* (2013.01); *H01L 29/0653* (2013.01); *H01L 29/0673* (2013.01);
(Continued)

(58) Field of Classification Search
CPC ......... H01L 29/42392; H01L 21/02603; H01L 21/823807; H01L 29/0673; H01L 27/092; H01L 21/823814; H01L 29/66545; H01L 21/02609; H01L 29/78696; H01L 29/045
See application file for complete search history.

(56) References Cited

U.S. PATENT DOCUMENTS 9,209,247 B2 12/2015 Colinge et al.
9,236,267 B2 1/2016 De et al.
(Continued)

*Primary Examiner* — Thanh Y. Tran
(74) *Attorney, Agent, or Firm* — McClure, Qualey & Rodack, LLP

(57) ABSTRACT

Semiconductor device structures are provided. The semiconductor device structure includes first semiconductor wires over a semiconductor substrate. The first semiconductor wires are vertically spaced apart from each other. The semiconductor device structure also includes a gate stack surrounding first portions of the first semiconductor wires, and a spacer element surrounding second portions of the first semiconductor wires. The first portions have a first width and the second portions have a second width. In addition, the semiconductor device structure includes a second semiconductor wire between the second portions. The second semiconductor wire has a third width, and the third width is substantially equal to the second width and greater than the first width.

20 Claims, 20 Drawing Sheets

(51) Int. Cl.
  *H01L 29/06* (2006.01)
  *H01L 29/423* (2006.01)
  *H01L 29/786* (2006.01)
  *H01L 29/66* (2006.01)
  *H01L 21/02* (2006.01)
  *H01L 29/04* (2006.01)

(52) U.S. Cl.
  CPC .. *H01L 29/42392* (2013.01); *H01L 29/66439* (2013.01); *H01L 29/66545* (2013.01); *H01L 29/78618* (2013.01); *H01L 29/78696* (2013.01); *H01L 29/045* (2013.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,290,548 B2 * | 5/2019 | Chiang ............. H01L 29/42392 |
| 2013/0062699 A1 | 3/2013 | Zhu et al. |
| 2017/0141188 A1 * | 5/2017 | Lee .................. H01L 29/42392 |
| 2017/0358646 A1 | 12/2017 | Fung |

\* cited by examiner

SEMICONDUCTOR DEVICE STRUCTURE WITH SEMICONDUCTOR WIRE

CROSS REFERENCE TO RELATED APPLICATIONS

This application is a Divisional of U.S. patent application Ser. No. 15/692,188, filed Aug. 31, 2017 and entitled "Semiconductor device structure with semiconductor wire", now U.S. Pat. No. 10,290,548, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

Such scaling down has also increased the complexity of processing and manufacturing ICs and, for these advances to be realized, similar developments in IC processing and manufacturing are needed. For example, a three-dimensional transistor, such as a semiconductor device with nanowires, has been introduced to replace a planar transistor. These relatively new types of semiconductor IC devices face manufacturing challenges, and they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1I-1 is a cross-sectional view of the semiconductor device structure taken along a sectional line I-I' shown in FIG. 1I, in accordance with some embodiments.

FIG. 1I-2 is a cross-sectional view of the semiconductor device structure taken along a sectional line II-II' shown in FIG. 1I, in accordance with some embodiments.

FIG. 1I-3 is a cross-sectional view of the semiconductor device structure taken along a sectional line shown in FIG. 1I, in accordance with some embodiments.

FIG. 1L-1 is a cross-sectional view of the semiconductor device structure taken along a sectional line I-I' shown in FIG. 1L, in accordance with some embodiments.

FIG. 1L-2 is a cross-sectional view of the semiconductor device structure taken along a sectional line II-II' shown in FIG. 1L, in accordance with some embodiments.

FIG. 1L-3 is a cross-sectional view of the semiconductor device structure taken along a sectional line III-III' shown in FIG. 1L, in accordance with some embodiments.

DETAILED DESCRIPTION

Figure 1A:
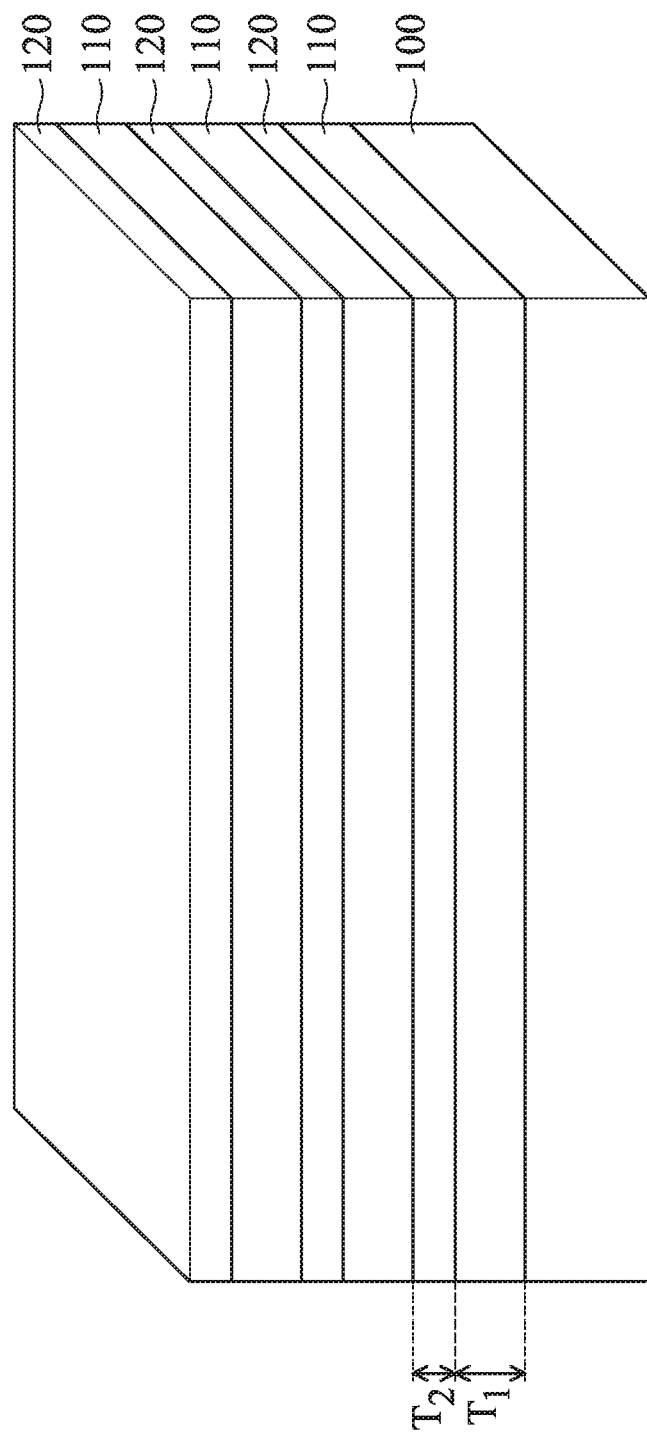
FIGS. 1A-1L are perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and they are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure form a semiconductor device structure with gate all around (GAA) transistor structures. The GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated and additional features can be added for different embodiments. Although some embodiments are discussed with operations performed in a particular order, these operations may be performed in another logical order.

FIGS. 1A-1L are perspective views of various stages of a process for forming a semiconductor device structure, in accordance with some embodiments. As shown in FIG. 1A, a semiconductor substrate 100 (such as a wafer) is provided. In some embodiments, the semiconductor substrate 100 is a bulk semiconductor substrate. The semiconductor substrate 100 may include silicon or another elementary semiconductor material (such as germanium) in a single crystal, polycrystal, or amorphous structure. In some other embodiments, the semiconductor substrate 100 includes a compound semiconductor. The compound semiconductor may include germanium tin, silicon germanium tin, gallium arsenide, silicon carbide, another suitable compound semiconductor, or a combination thereof. In some embodiments, the semiconductor substrate 100 includes a semiconductor-on-insulator (SOI) substrate (such as silicon on insulator or germanium on insulator).

As shown in FIG. 1A, multiple semiconductor layers 110 and 120 are alternately deposited over the semiconductor substrate 100, in accordance with some embodiments. Therefore, the semiconductor layers 110 and 120 are vertically stacked and positioned at different levels. Although FIG. 1A shows three semiconductor layers 110 and three semiconductor layers 120, embodiments of the disclosure are not limited thereto. There may be more or less semiconductor layers 110 and 120 than those shown in FIG. 1A.

The semiconductor layers 110 and 120 have different thicknesses. In some embodiments, each of the semiconductor layers 110 is thicker than each of the semiconductor layers 120. In some embodiments, the thickness $T_1$ of each of the semiconductor layers 110 is in a range from about 7 nm to about 8 or 9 nm. In some embodiments, the thickness $T_2$ of each of the semiconductor layers 120 is in a range from about 4 nm to about 5 or 6 nm. In some embodiments, the difference between the thickness $T_1$ and $T_2$ is in a range from about 1 nm to about 5 nm. In some embodiments, a ratio of the thickness $T_1$ to the thickness $T_2$ is in a range from about 1.16 to about 2.25. It should be noted that these ranges are only examples and are not a limitation to the disclosure. In some other embodiments, each of the semiconductor layers 110 is thinner than each of the semiconductor layers 120.

In some embodiments, the semiconductor layers 110 and 120 include silicon, silicon germanium, germanium tin, silicon germanium tin, or another suitable semiconductor material. In some embodiments, the semiconductor layers 110 are made of a different material than that of the semiconductor layers 120. In some embodiments, the semiconductor layers 110 are made of silicon germanium, and the semiconductor layers 120 are made of silicon. In these embodiments, the thickness $T_1$ is greater than the thickness $T_2$. In some other embodiments, the semiconductor layers 110 are made of silicon, and the semiconductor layers 120 are made of silicon germanium. In these embodiments, the thickness $T_1$ is less than the thickness $T_2$.

In some embodiments, the semiconductor layers 110 and 120 are formed using an epitaxial growth process. Each of the semiconductor layers 110 and 120 may be formed using a selective epitaxial growth (SEG) process, a chemical vapor deposition (CVD) process (e.g., a vapor-phase epitaxy (VPE) process, a low pressure CVD process, and/or an ultra-high vacuum CVD process), a molecular beam epitaxy process, other applicable processes, or a combination thereof. In some embodiments, the semiconductor layers 110 and 120 are grown in-situ in the same process chamber.

Figure 1B:
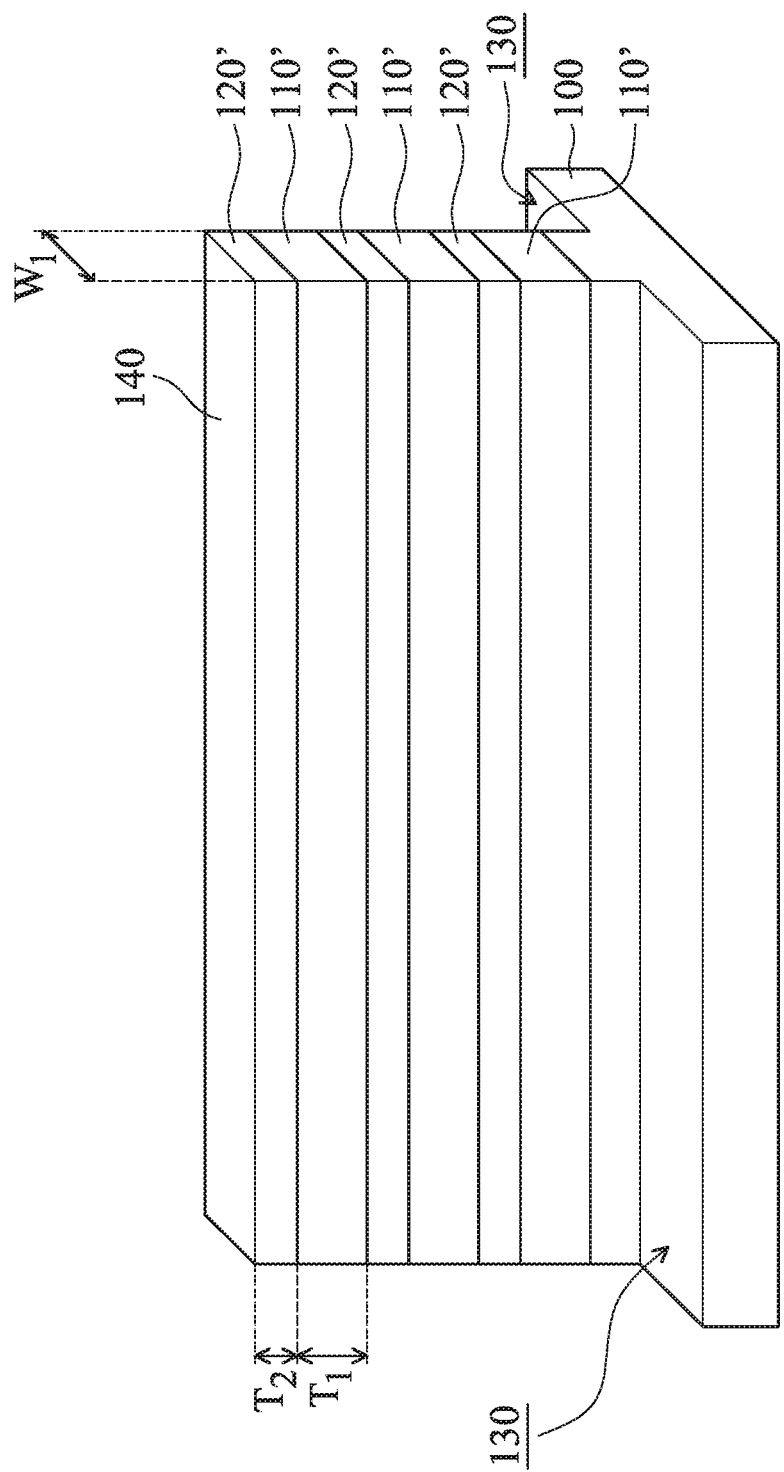

As shown in FIG. 1B, multiple recesses (or trenches) 130 are formed to pattern the semiconductor layers 110 and 120, in accordance with some embodiments. As a result, multiple fin structures are formed between the recesses 130. One fin structure 140 is shown in FIG. 1B as an example. The semiconductor layers 110 and 120 are patterned into semiconductor wires 110' and 120', respectively. The stacked semiconductor wires 110' and 120' form the fin structure 140. The semiconductor wires 110' and 120' may be also referred to as nanowires. In some embodiments, the width $W_1$ of the semiconductor wires 110' and 120' is in a range from about 7 nm to about 8 or 9 nm.

In some embodiments, the recesses 130 further extend into the semiconductor substrate 100. As a result, the fin structure 140 further includes a fin portion of the semiconductor substrate 100 between the recesses 130, as shown in FIG. 1B. In some embodiments, multiple photolithography processes and etching processes are performed to form the recesses 130. Embodiments of the disclosure are not limited thereto. In some other embodiments, the recesses 130 do not extend into the semiconductor substrate 100 and the semiconductor substrate 100 does not have a fin portion.

Figure 1C:
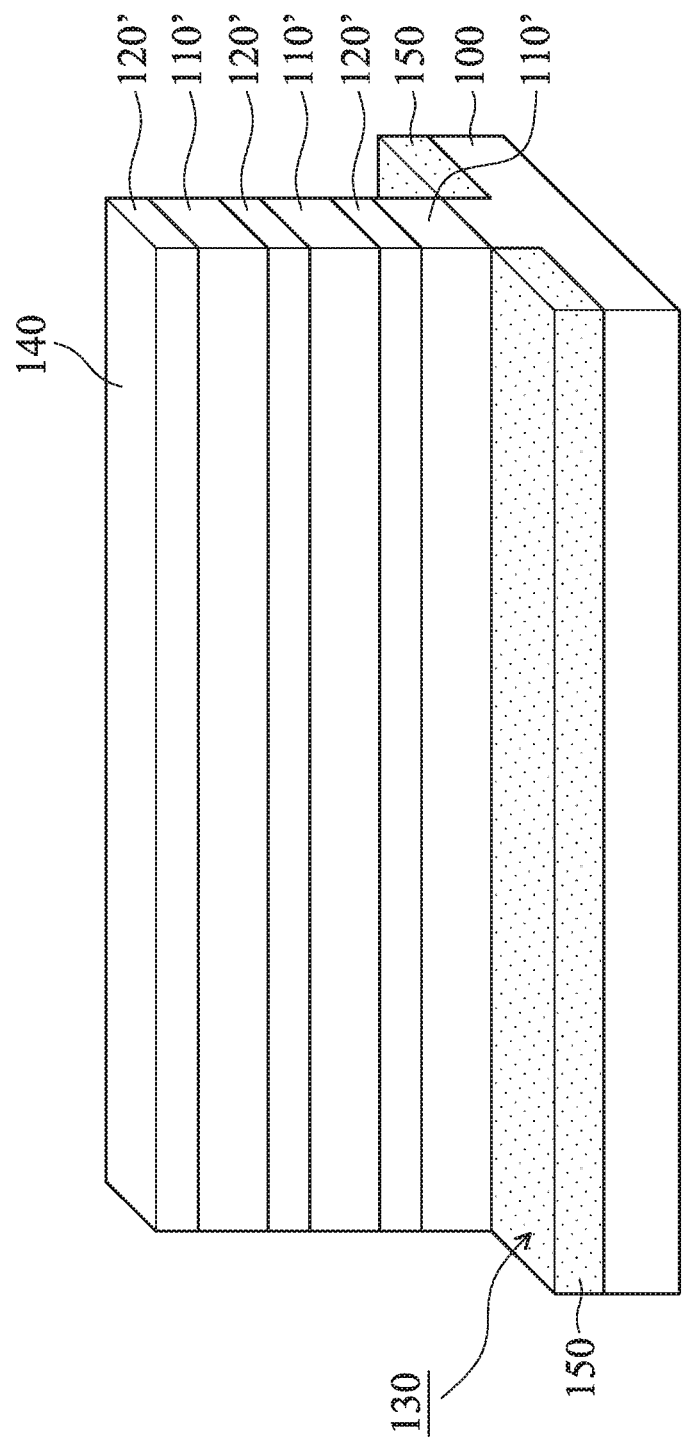

As shown in FIG. 1C, isolation features 150 are formed in the recesses 130, in accordance with some embodiments. The isolation features 150 are used to define and electrically isolate various device elements formed in and/or over the semiconductor substrate 100. For example, the isolation features 150 may be used to separate two neighboring field effect transistors (FETs). In some embodiments, the isolation features 150 include shallow trench isolation (STI) features, local oxidation of silicon (LOCOS) features, other suitable isolation features, or a combination thereof.

In some embodiments, the isolation features 150 are made of a dielectric material. The dielectric material may include silicon oxide, silicon nitride, silicon oxynitride, spin-on glass, low-K dielectric material, other suitable materials, or a combination thereof. In some embodiments, a dielectric material layer is deposited over the semiconductor substrate 100. The dielectric material layer covers the fin structure 140 and fills the recesses 130. In some embodiments, the dielectric material layer is deposited using a CVD process, a spin-on process, another applicable process, or a combination thereof. In some embodiments, a planarization process is subsequently performed to thin down the dielectric material layer until the fin structure 140 (such as the topmost of the semiconductor wires 120') are exposed. The planarization process may include a chemical mechanical polishing (CMP) process, a grinding process, an etching process, another applicable process, or a combination thereof. Afterwards, the dielectric material layer is etched back to form the isolation features 150. In some embodiments, the semiconductor wires 110' and 120' are not surrounded or covered by the isolation features 150.

Figure 1D:
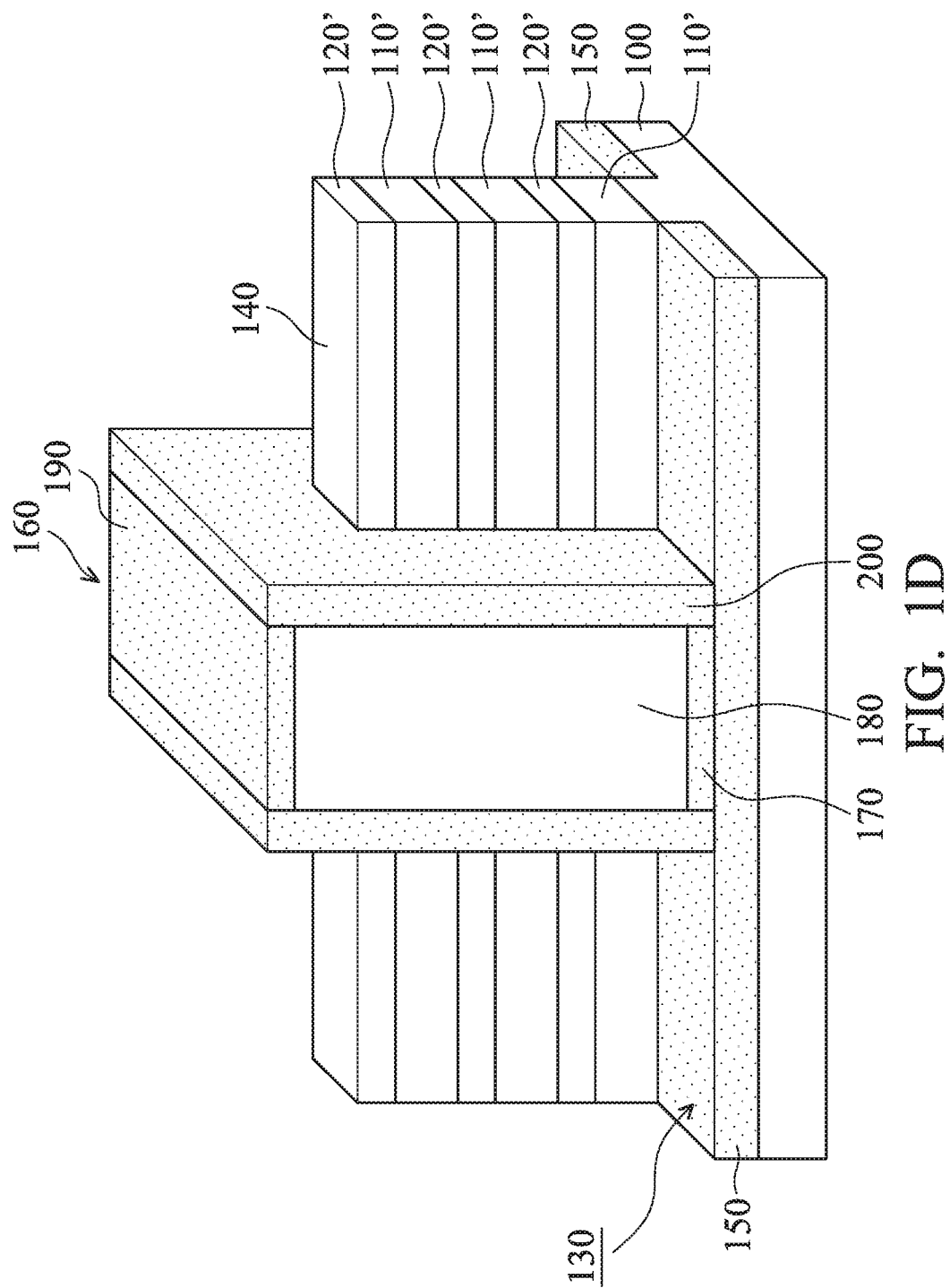

Afterwards, multiple dummy or sacrificial gate stacks are formed over the semiconductor substrate 100, in accordance with some embodiments. One dummy gate stack 160 is shown in FIG. 1D as an example. The dummy gate stack 160 covers portions of the fin structure 140 and the isolation features 150.

In some embodiments, the dummy gate stack 160 includes a dummy dielectric layer 170, a dummy gate electrode 180, and a hard mask 190. The dummy dielectric layer 170 is deposited over the top and the sidewalls of the fin structure 140, in accordance with some embodiments. In some embodiments, the dummy dielectric layer 170 is made of a dielectric material, such as silicon oxide. In some embodiments, the dummy dielectric layer 170 is conformally deposited over the fin structure 140. The dummy dielectric layer 170 may be deposited using a CVD process, an atomic layer deposition (ALD) process, a physical vapor deposition (PVD) process, a spin-on process, another applicable process, or a combination thereof.

In some embodiments, the dummy gate electrode 180 is made of polysilicon. The dummy gate electrode 180 will be replaced with another conductive material (such as a metal material). The hard mask 190 is used to assist in the patterning process for forming the dummy gate stack 160. In some embodiments, the hard mask 190 is made of silicon oxide, silicon nitride, silicon oxynitride, silicon carbide, another suitable material, or a combination thereof. In some embodiments, the hard mask 190 has a multi-layer structure. Many variations and modifications can be made to embodiments of the disclosure. In some other embodiments, the hard mask 190 is not formed.

In some embodiments, a dummy gate electrode layer and one or more hard mask layers are deposited over the dummy dielectric layer 170. Afterwards, a photolithography process and an etching process are performed to pattern the hard mask layer so as to form the hard mask 190. With the assistance of the hard mask 190, the dummy gate electrode layer is patterned. As a result, the dummy gate electrode 180 is formed. During the etching process for forming the dummy gate electrode 180, the dummy dielectric layer 170 may serve as an etch stop layer to protect the fin structure 140 under the dummy dielectric layer 170. Afterwards, the portions of the dummy dielectric layer 170 that are not covered by the dummy gate electrode 180 are removed. As a result, the dummy dielectric layer 170 is patterned, and the dummy gate stack 160 is formed, as shown in FIG. 1D.

As shown in FIG. 1D, spacer elements 200 are formed over the sidewalls of the dummy gate stack 160, in accordance with some embodiments. The spacer elements 200 may be used to assist in the formation of source or drain structures (or regions) in subsequent processes. In some embodiments, the spacer elements 200 partially cover the top portions and the sidewalls of the fin structure 140.

In some embodiments, the spacer elements 200 are made of a dielectric material. The dielectric material may include silicon carbon nitride, silicon nitride, silicon oxynitride, silicon carbide, another suitable dielectric material, or a combination thereof. In some embodiments, a spacer layer is conformally deposited over the semiconductor substrate 100. The spacer layer may be deposited using a CVD process, a PVD process, a spin-on process, another applicable process, or a combination thereof. Afterwards, an etching process, such as an anisotropic etching process, is performed to partially remove the spacer layer. As a result, the remaining portions of the spacer layer over the sidewalls of the dummy gate stack 160 form the spacer elements 200.

Figure 1E:
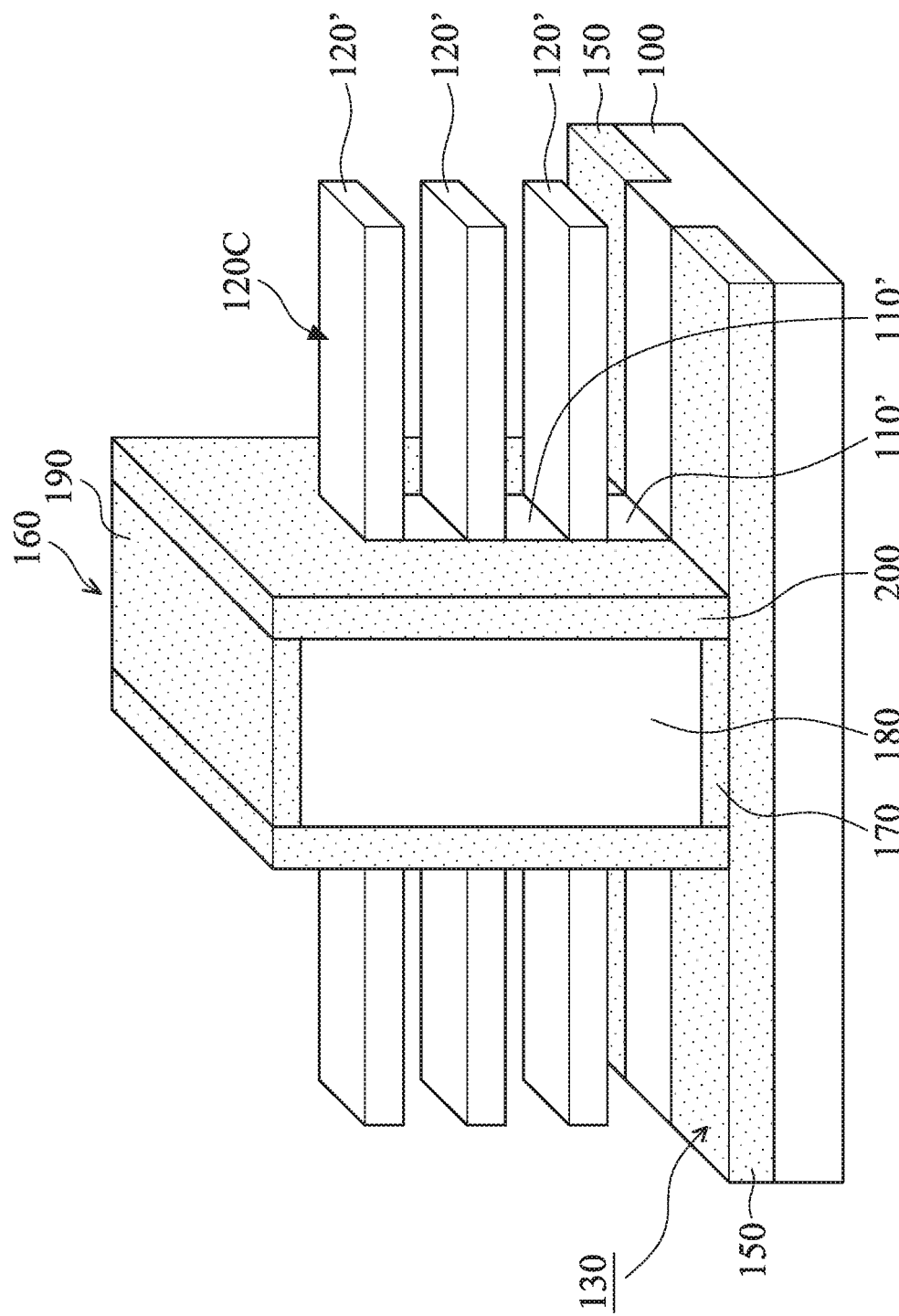

As shown in FIG. 1E, the portions of the semiconductor wires 110' that are not under the dummy gate stack 160 and the spacer elements 200 are removed, in accordance with some embodiments. In some embodiments, an etching process is used to partially remove the semiconductor wires 110'. As a result, space is created for a subsequent formation process of source or drain structures. The portions 120C of the semiconductor wires 120' that are not under the dummy gate stack 160 and the spacer elements 200 are not removed.

Figure 1F:
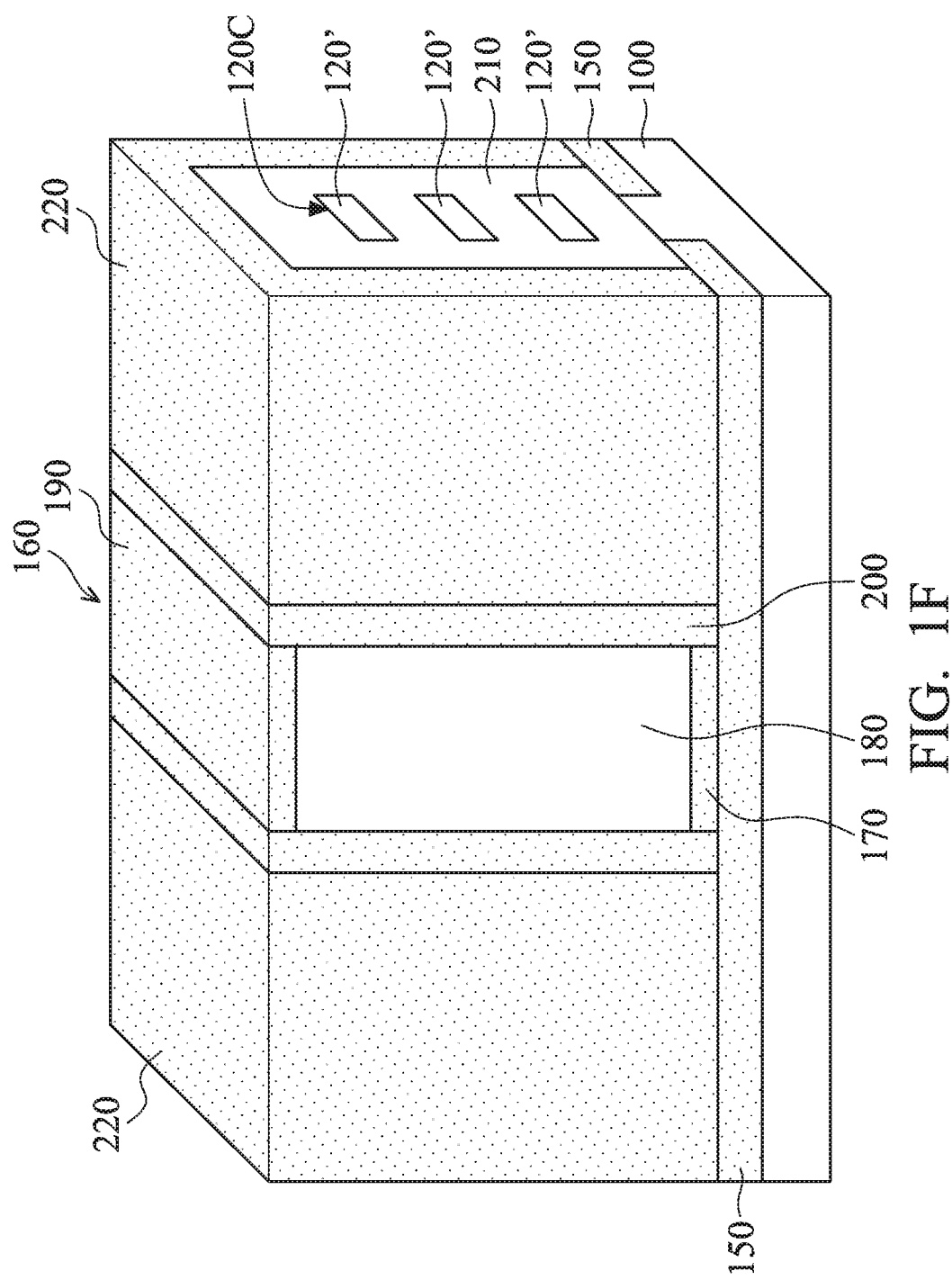

As shown in FIG. 1F, source or drain structures 210 are formed over the semiconductor substrate 100, in accordance with some embodiments. The source or drain structures 210 surround the portions 120C of the semiconductor wires 120'. The source or drain structures 210 may be used to provide stress or strain to channel regions. As a result, the carrier mobility of the device and device performance are improved.

In some embodiments, a semiconductor material (or two or more semiconductor materials) is epitaxially grown over the semiconductor substrate 100 so as to form the source or drain structures 210. In some embodiments, the source or drain structures 210 are a P-type semiconductor material. In some embodiments, the source or drain structures 210 are an N-type semiconductor material. The source or drain structures 210 may include epitaxially grown silicon, silicon-germanium, epitaxially grown phosphorous-doped silicon (Si:P), boron-doped silicon germanium (SiGe:B), or another suitable semiconductor material. In some embodiments, the source or drain structures 210 are formed using a SEG process, a CVD process (e.g., a VPE process, a LPCVD process, and/or an UHV-CVD process), a molecular beam epitaxy process, deposition of doped amorphous semiconductor followed by a solid-phase epitaxial recrystallization step, another applicable process, or a combination thereof.

In some embodiments, the source or drain structures 210 are doped with one or more suitable dopants. For example, the source or drain structures 210 are Si source or drain features doped with phosphorus, arsenic, antimony, or another suitable dopant. Alternatively, the source or drain structures 210 are SiGe source or drain features doped with boron or another suitable dopant. In some embodiments, multiple implantation processes are performed to dope the source or drain structures 210. In some embodiments, the source or drain structures 210 are doped in-situ during the growth of the source or drain structures 210. In some other embodiments, the source or drain structures 210 are not doped during the growth of the source or drain structures 210. After the epitaxial growth, the source or drain structures 210 are doped in a subsequent process. In some embodiments, the doping is achieved using an ion implantation process, a plasma immersion ion implantation process, a gas and/or solid source diffusion process, another applicable process, or a combination thereof. In some embodiments, the source or drain structures 210 are further exposed to an annealing process (such as a rapid thermal annealing process) to activate the dopants.

As shown in FIG. 1F, a dielectric layer 220 is deposited over the semiconductor substrate 100, in accordance with some embodiments. The dielectric layer 220 serves as an interlayer dielectric (ILD) layer. In some embodiments, the dielectric layer 220 is made of silicon oxide, silicon oxynitride, borosilicate glass (BSG), phosphosilicate glass (PSG), borophosphosilicate glass (BPSG), fluorinated silicate glass (FSG), low-K material, porous dielectric material, another suitable dielectric material, or a combination thereof.

In some embodiments, the dielectric layer 220 is deposited using a CVD process, a spin-on process, an ALD process, a PVD process, another applicable process, or a combination thereof. In some embodiments, the dielectric layer 220 covers the isolation features 150, the dummy gate stack 160, the spacer elements 200, and the source or drain structures 210. Afterwards, the dielectric layer 220 is thinned down until the dummy gate stack 160 and the spacer elements 200 are exposed. In some embodiments, a planarization process (such as a CMP process) is performed to thin down the dielectric layer 220.

In accordance with some embodiments, the semiconductor device structure is divided into multiple regions 100A and 100B. In some embodiments, an N-type FET is configured to form in the region 100A while a P-type FET is configured to form in the region 100B. Afterwards, a first mask layer (not shown) is formed over the dielectric layer 220 in the regions 100A and 100B to assist in the subsequent etching processes. In some embodiments, the first mask layer covers the regions 100A and 100B without covering the dummy gate stack 160 in the region 100A. In some embodiments, the first mask layer is a patterned photoresist layer.

Figure 1G:
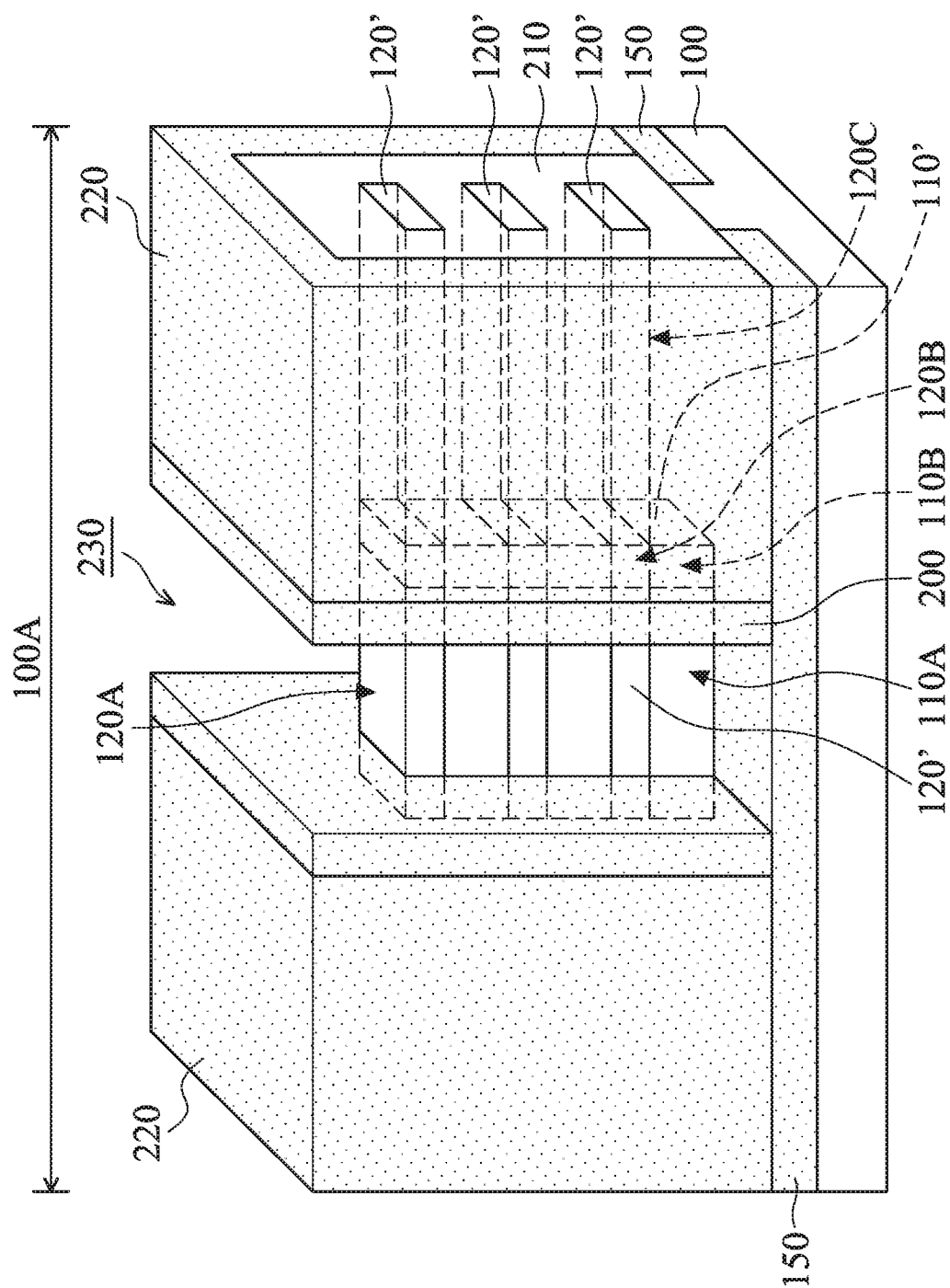

As shown in FIG. 1G, the dummy gate stack 160 in the region 100A is removed, in accordance with some embodiments. As a result, a recess 230 is formed over the semiconductor substrate 100 in the region 100A. In some embodiments, the dummy gate stack 160 is removed using a wet etching process, a dry etching process, another applicable process, or a combination thereof.

In some embodiments, the portions 110A of the semiconductor wires 110' are exposed from the recess 230, and the portions 110B of the semiconductor wires 110' are covered by the spacer elements 200, as shown in FIG. 1G. The portions 120A of the semiconductor wires 120' are exposed from the recess 230. The portions 120B of the semiconductor wires 120' are covered by the spacer elements 200. The portions 120C of the semiconductor wires 120' are covered by the source or drain structures 210. The portions 110B, 120B and 120C are illustrated as dashed lines so that they are still visible in FIG. 1G for a better understanding of the structure.

Figure 1H:
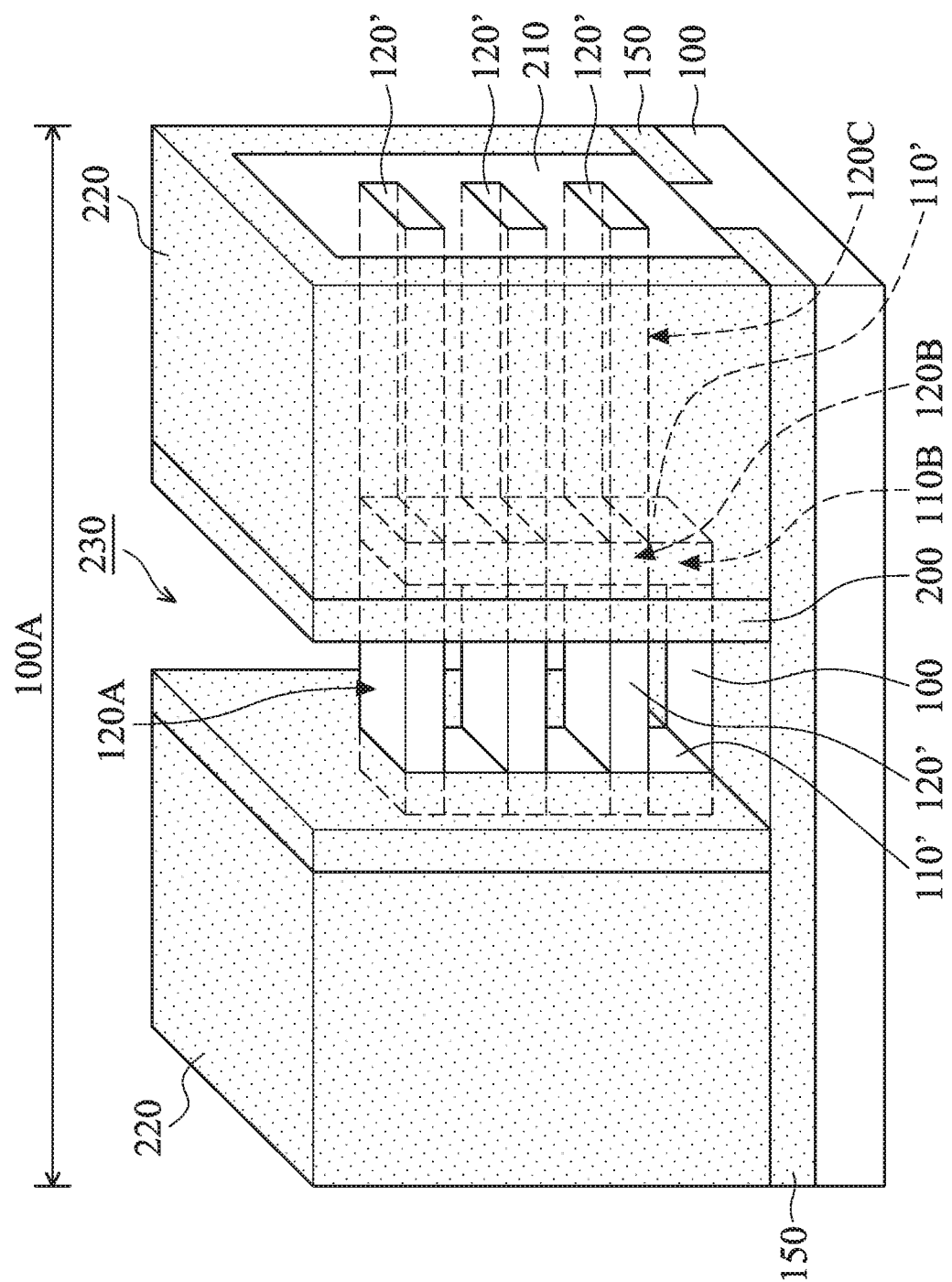

As shown in FIG. 1H, the portions 110A of the semiconductor wires 110' are removed, in accordance with some embodiments. As a result, the portions 120A of the semiconductor wires 120' suspend between the spacer elements 200. The portions 120A serve as channel regions of FETs in the region 100A.

In some embodiments, the portions 120A have a rectangular cross-sectional profile since the width $W_1$ of the portions 120A is greater than the thickness $T_2$ of the portions 120A. The corners and/or edges of the portions 120A may be relatively rounded. In some other embodiments, the portions 120A have an oval cross-sectional profile. In some embodiments, the cross-sectional profile of the portions 120A is not square or circular.

The portions 110B of the semiconductor wires 110' remain covered by the spacer elements 200, as shown in FIG. 1H. The portions 120A are spaced apart or separated from one another by an interval (or spacing) that is substantially equal to the thickness $T_1$ of the portions 110B. The interval between the portions 120A is different from the thickness $T_2$ of the portions 120A. In some embodiments, the interval between the portions 120A is greater than the thickness $T_2$. Therefore, it becomes much easier to enclose the portions 120A with a subsequently formed metal gate stack. The process window of the metal gate stack is increased without enlarging the total thickness of the semiconductor wires 110' and 120' (i.e., the height of the fin structure 140 shown in FIG. 1B). In addition, the driving current of the semiconductor device structure is also prevented from degradation, which may be induced by reducing the number of semiconductor wires for increasing the interval or space between semiconductor wires.

In some embodiments, an etching process is performed to selectively remove the portions 110A of the semiconductor wires 110' without removing the portions 120A of the semiconductor wires 120'. In some embodiments, the etching process includes a wet etching process, a dry etching process, or another suitable etching process. In some embodiments, the etchant used in the etching process includes a liquid mixture. The liquid mixture may include NH$_4$OH, ammonia-peroxide mixture (APM), tetramethyl ammonium hydroxide (TMAH), another suitable solution, or a combination thereof. In some other embodiments, the etchant used in the etching process includes a gas mixture. The gas mixture may include $CF_4$, $SF_6$, $CH_3F$, another suitable gas, or a combination thereof. During the etching operations, the composition of the etchant may be varied according to requirements. In some embodiments, the etchant has a sufficiently high etch selectivity of the semiconductor wires 110' to the semiconductor wires 120'. As a result, the semiconductor wires 110' are etched much faster than the semiconductor wires 120'.

Figure 1I:
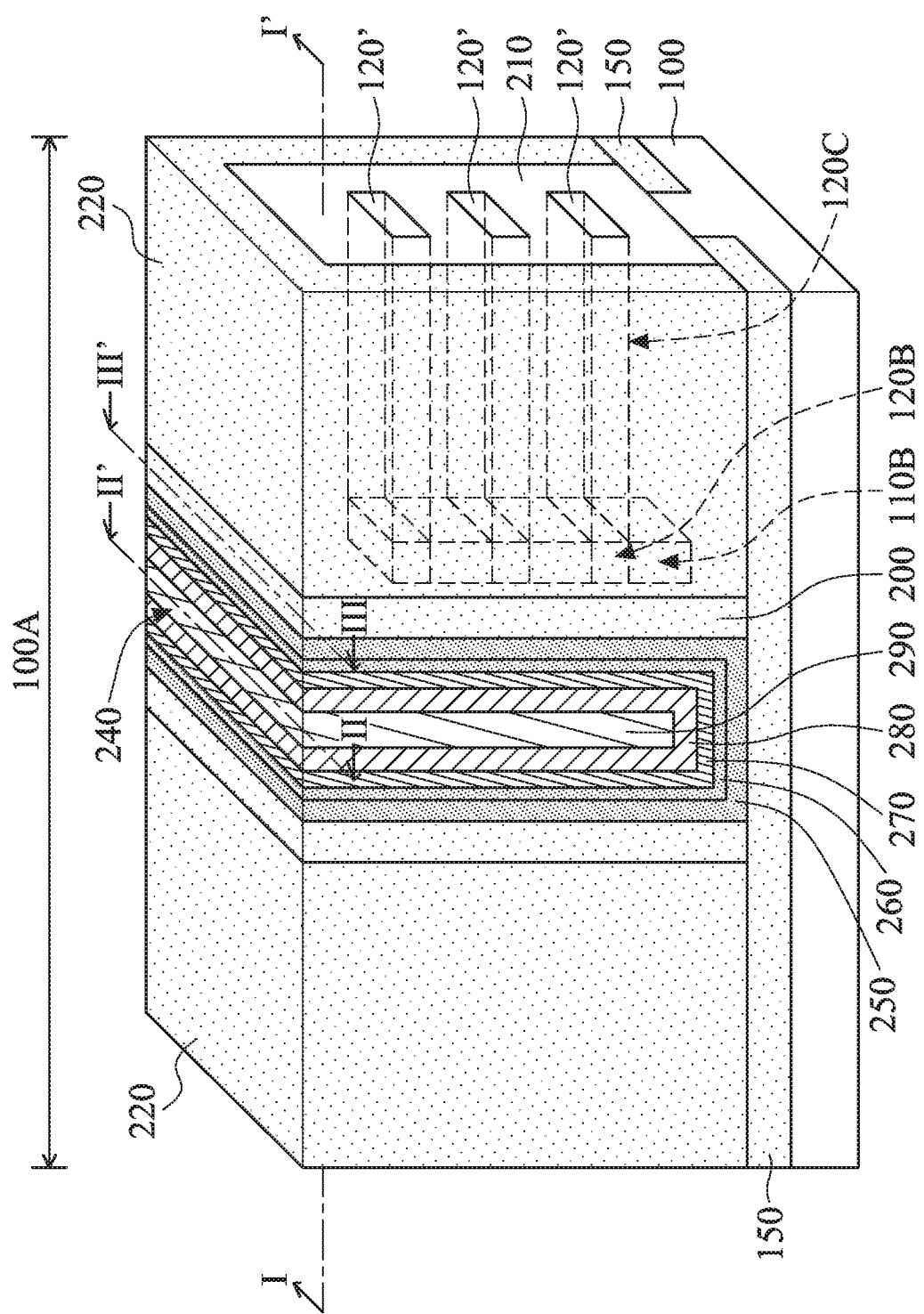

As shown in FIG. 1I, a metal gate stack 240 is formed in the recess 230 in the region 100A, in accordance with some embodiments. The metal gate stack 240 encircles the portions 120A of the semiconductor wires 120'. For illustration purposes, the portions 120A covered by the metal gate stack 240 are not shown in FIG. 1I.

As shown in FIG. 1I, the metal gate stack 240 includes an interfacial layer 250, a gate dielectric layer 260, and metal gate stacking layers 270, 280 and 290, in accordance with some embodiments. The interfacial layer 250 is used to reduce stress between the gate dielectric layer 260 and the portions 120A of the semiconductor wires 120'. The interfacial layer 250 may include silicon oxide or another suitable material. In some embodiments, the interfacial layer 250 is formed using an ALD process, a thermal oxidation process, another applicable process, or a combination thereof.

In some embodiments, the gate dielectric layer 260 includes a high-k material layer. The term "high-k material" may mean a material having a dielectric constant greater than the dielectric constant of silicon dioxide. The high-K dielectric layer may be made of hafnium oxide, zirconium oxide, aluminum oxide, silicon oxynitride, hafnium silicon oxynitride, hafnium tantalum oxide, another suitable high-K material, or a combination thereof. In some embodiments, the gate dielectric layer 260 is deposited using an ALD process, a CVD process, a spin-on process, another applicable process, or a combination thereof. In some embodiments, a high-temperature annealing operation is performed to reduce or eliminate defects in the gate dielectric layer 260.

In some embodiments, the metal gate stacking layers 270, 280 and 290 include a barrier layer, one or more work function layers, a blocking layer, a glue layer, a metal filling layer, one or more other suitable metal gate layers, and combinations thereof. Although FIG. 1I shows three metal gate stacking layers 270, 280 and 290, embodiments of the disclosure are not limited thereto. There may be more or less metal gate stacking layers than those shown in FIG. 1I.

More specifically, the barrier layer may be used to interface the gate dielectric layer 260 with the work function layer. The barrier layer may also be used to prevent diffusion between the gate dielectric layer 260 and the work function layer. The blocking layer may be used to prevent the metal filling layer from diffusing or penetrating into the work function layer. The glue layer may be used to increase the adhesion between the work function layer and the metal filling layer so as to prevent peeling or delamination of the metal filling layer. In some embodiments, each of the barrier layer, the blocking layer and the glue layer is made of or includes tantalum nitride, titanium nitride, another suitable material, or a combination thereof. In some embodiments, the metal filling layer is made of or includes tungsten, aluminum, copper, cobalt, another suitable material, or a combination thereof.

The work function layer is used to provide the desired work function for transistors to enhance device performance including improved threshold voltage (Vt). In the embodiments of forming an NMOS transistor, the work function layer can be an N-type metal layer, which is capable of providing a work function value suitable for the device. The work function value may be substantially equal to or less than about 4.5 eV. The N-type metal layer may include metal, metal carbide, metal nitride, or a combination thereof.

For example, the N-type metal layer includes titanium nitride, tantalum, tantalum nitride, another suitable material, or a combination thereof.

On the other hand, in the embodiments of forming a PMOS transistor, the work function layer can be a P-type metal layer, which is capable of providing a work function value suitable for the device. The work function value may be substantially equal to or greater than about 4.8 eV. The P-type metal layer may include metal, metal carbide, metal nitride, other suitable materials, or a combination thereof. For example, the P-type metal includes tantalum nitride, tungsten nitride, titanium, titanium nitride, another suitable material, or a combination thereof.

The thickness and/or the composition of the work function layer may be fine-tuned to adjust the work function level. For example, a titanium nitride layer may be used as a P-type metal layer or an N-type metal layer, depending on the thickness and/or the composition of the titanium nitride layer.

The metal gate stacking layers 270, 280 and 290 are sequentially deposited by using suitable deposition methods. The suitable deposition methods may include an ALD process, a PVD process, an electroplating process, an electroless plating process, a CVD process, other applicable processes, or a combination thereof. In some embodiments, the interfacial layer 250, the gate dielectric layer 260, and the metal gate stacking layers 270, 280 and 290 fill the recess 230. In some embodiments, portions of the interfacial layer 250, the gate dielectric layer 260, and the metal gate stacking layers 270, 280 and 290 outside of the recess 230 are removed using a planarization process (such as a CMP process). The planarization process is performed until the dielectric layer 220 is exposed. As a result, portions of the interfacial layer 250, the gate dielectric layer 260, and the metal gate stacking layers 270, 280 and 290 remaining in the recess 230 form the metal gate stack 240, as shown in FIG. 1I.

Figures 1, 1I:
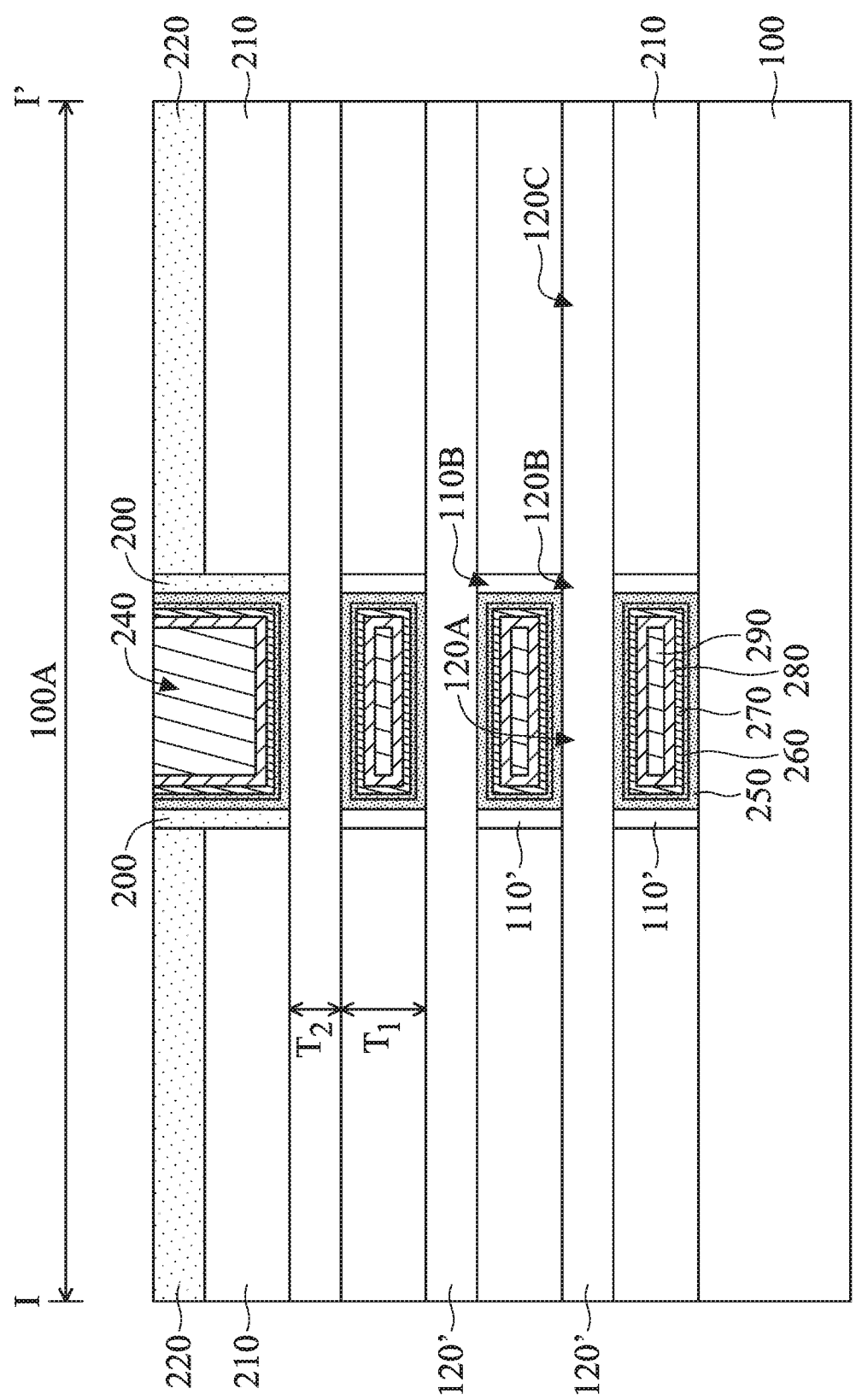
Figures 1, 1I, 2:
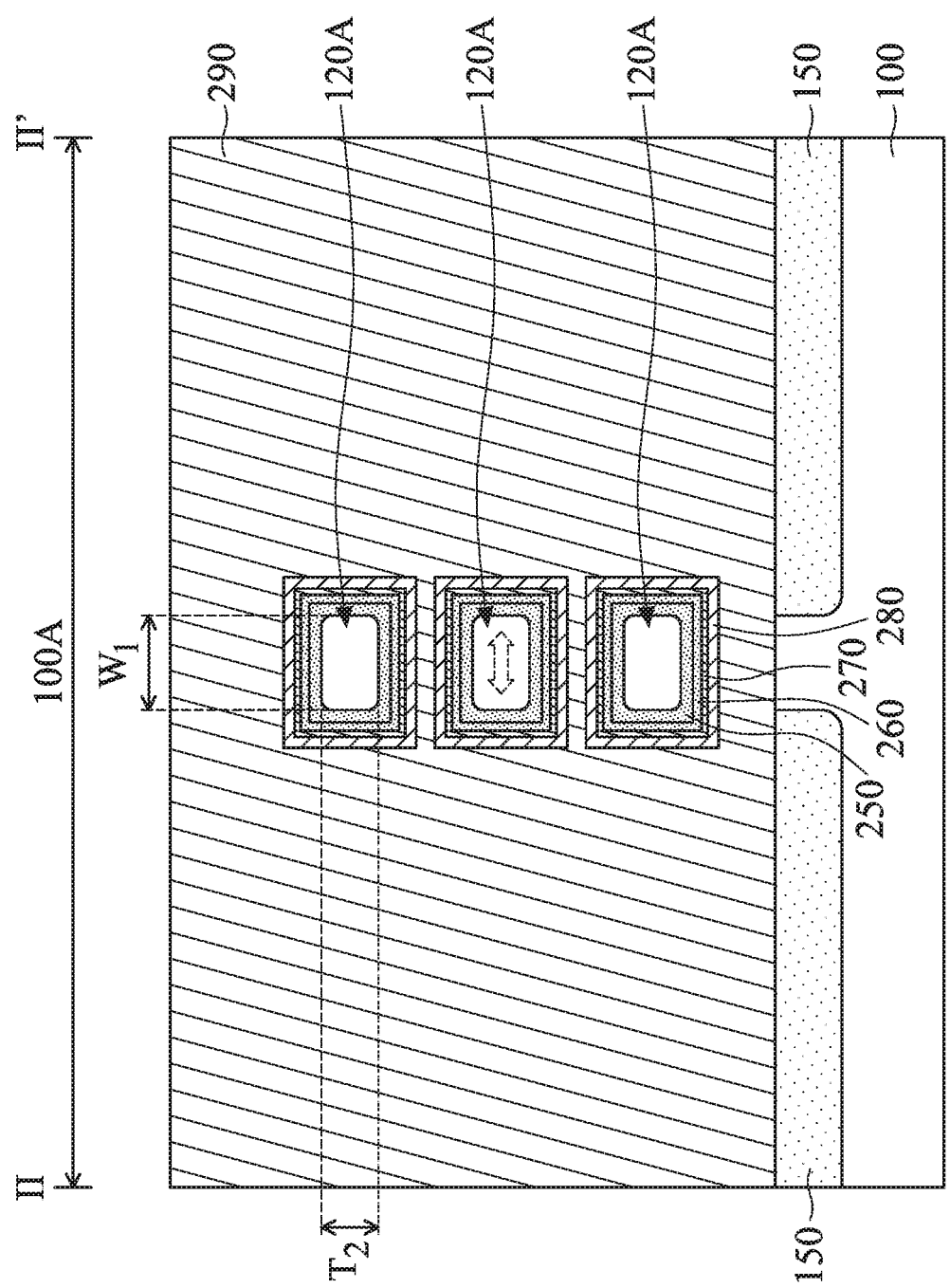
Figures 1, 1I, 2, 3:
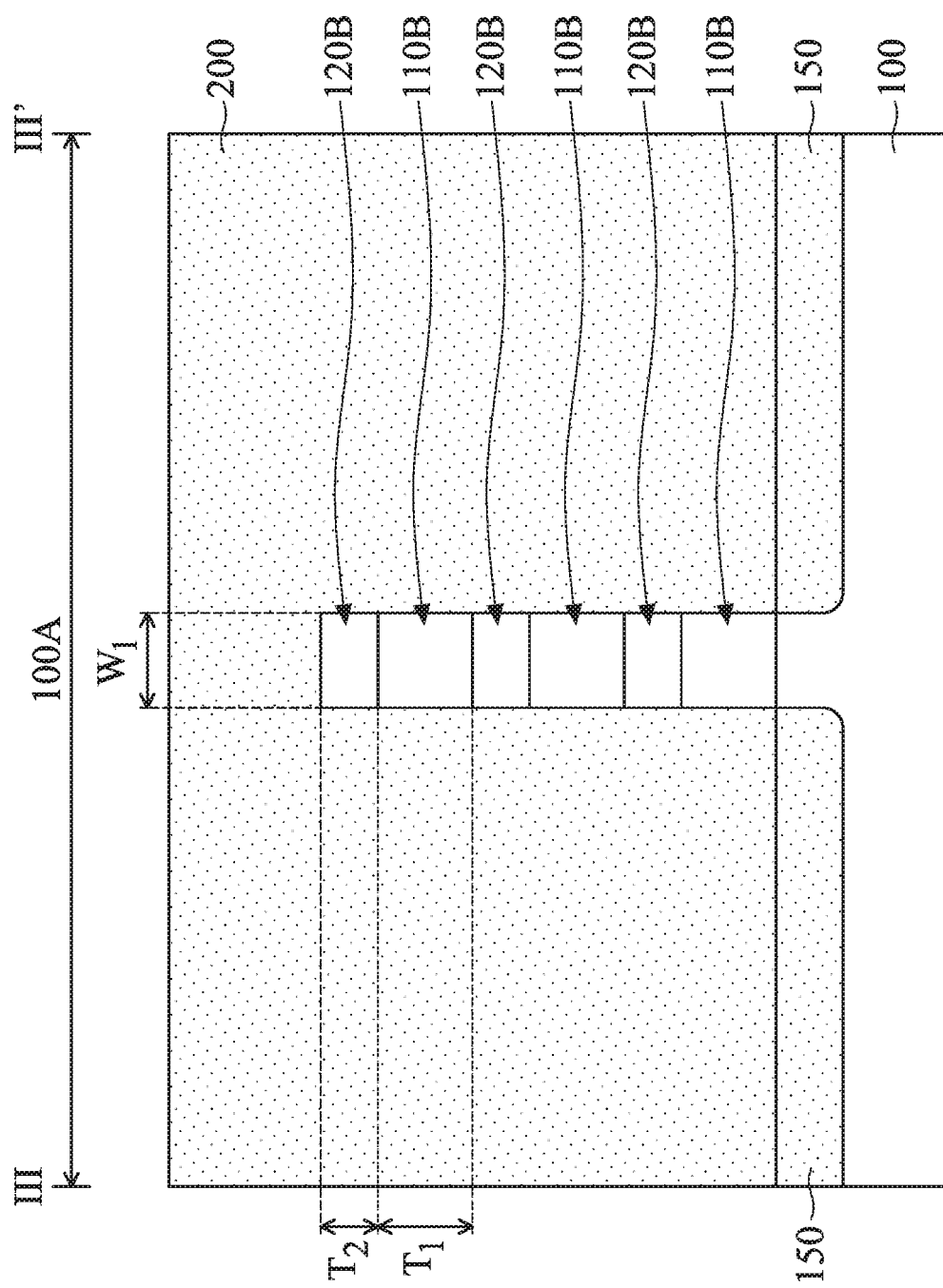

FIG. 1I-1 is a cross-sectional view of the semiconductor device structure taken along a sectional line I-I' shown in FIG. 1I, in accordance with some embodiments. The sectional line I-I' extends along the semiconductor wires 120'. FIG. 1I-2 is a cross-sectional view of the semiconductor device structure taken along a sectional line II-IF shown in FIG. 1I, in accordance with some embodiments. The sectional line II-IF extends along the metal gate stack 240. FIG. 1I-3 is a cross-sectional view of the semiconductor device structure taken along a sectional line shown in FIG. 1I, in accordance with some embodiments. The sectional line extends along the spacer elements 200.

As shown in FIG. 1I-1, the portions 120A of the semiconductor wires 120' are surrounded by the metal gate stack 240 in the region 100A, in accordance with some embodiments. The portions 120B of the semiconductor wires 120' are vertically sandwiched between the portions 110B of the semiconductor wires 110'. The portions 120C of the semiconductor wires 120' are surrounded by the source or drain structures 210. The portions 120C may have substantially the same cross-sectional profile and area (such as the width and thickness) as the portions 120A and/or the portions 120B.

As shown in FIG. 1I-2, the portions 120A of the semiconductor wires 120' are embedded in the metal gate stack 240 in the region 100A, in accordance with some embodiments. In some embodiments, the interfacial layer 250, the gate dielectric layer 260, and all the metal gate stacking layers 270, 280 and 290 are between two of the portions 120A. In some other embodiments, the interfacial layer 250, the gate dielectric layer 260, and more than one of the metal gate stacking layers 270, 280 and 290 are between two of the portions 120A.

Since the space between the portions 120A is large enough, the metal gate stack 240, especially the work function layer(s), can be uniformly formed between the portions 120A. As shown in FIGS. 1I-1 and 1I-2, the metal gate stacking layers 270, 280 and 290 uniformly surround each of the portions 120A. The uniform work function level results in uniform threshold voltage. Therefore, the device performance of the semiconductor device structure at on-state is improved and current leakage at off-state is avoided.

In accordance with some embodiments, the width $W_1$ of the portions 120A is greater than the thickness $T_2$ of the portions 120A, as shown in FIG. 1I-2. In some embodiments, a ratio of the thickness $T_2$ to the width $W_1$ is in a range from about 0.3 to about 0.6. The mobility of electrons in the portions 120A (such as silicon) is large or the maximum in the (100) crystalline plane and in the [100] crystalline direction, as indicated by the dashed arrow in FIG. 1I-2. The width $W_1$ is along the [100] crystalline direction. As a result, the effective area of channel regions or effective channel width ($W_{eff}$) of the transistor in the region 100A is greatly increased. The operation speed of the transistor in the region 100A can be improved. Accordingly, the device performance of the semiconductor device structure at on-state is significantly enhanced.

As shown in FIG. 1I-3, the vertically stacked portions 110B and 120B are covered by the spacer elements 200 in the region 100A, in accordance with some embodiments. In some embodiments, the width $W_1$ is substantially equal to the thickness $T_1$ of the portions 110B. Accordingly, the cross-sectional profile of the portions 110B may be square. However, embodiments of the disclosure are not limited thereto. The width $W_1$ may be greater or less than the thickness $T_1$. In some embodiments, the width $W_1$ is greater than the thickness $T_2$ of the portions 120B. The width $W_1$ may be slightly less than the thickness $T_1$ but greater than the thickness $T_2$. The portions 120B shown in FIG. 1I-3 and the portions 120A shown in FIG. 1I-2 may have slightly different profile. The portions 120B shown in FIG. 1I-3 may have a slightly larger area than the portions 120A shown in FIG. 1I-2.

Afterwards, a second mask layer (not shown) is formed over the dielectric layer 220 in the regions 100A and 100B to assist in the subsequent etching processes. In some embodiments, the second mask layer covers the regions 100A and 100B without covering the dummy gate stack 160 in the region 100B. In some embodiments, the second mask layer is a patterned photoresist layer.

Figure 1J:
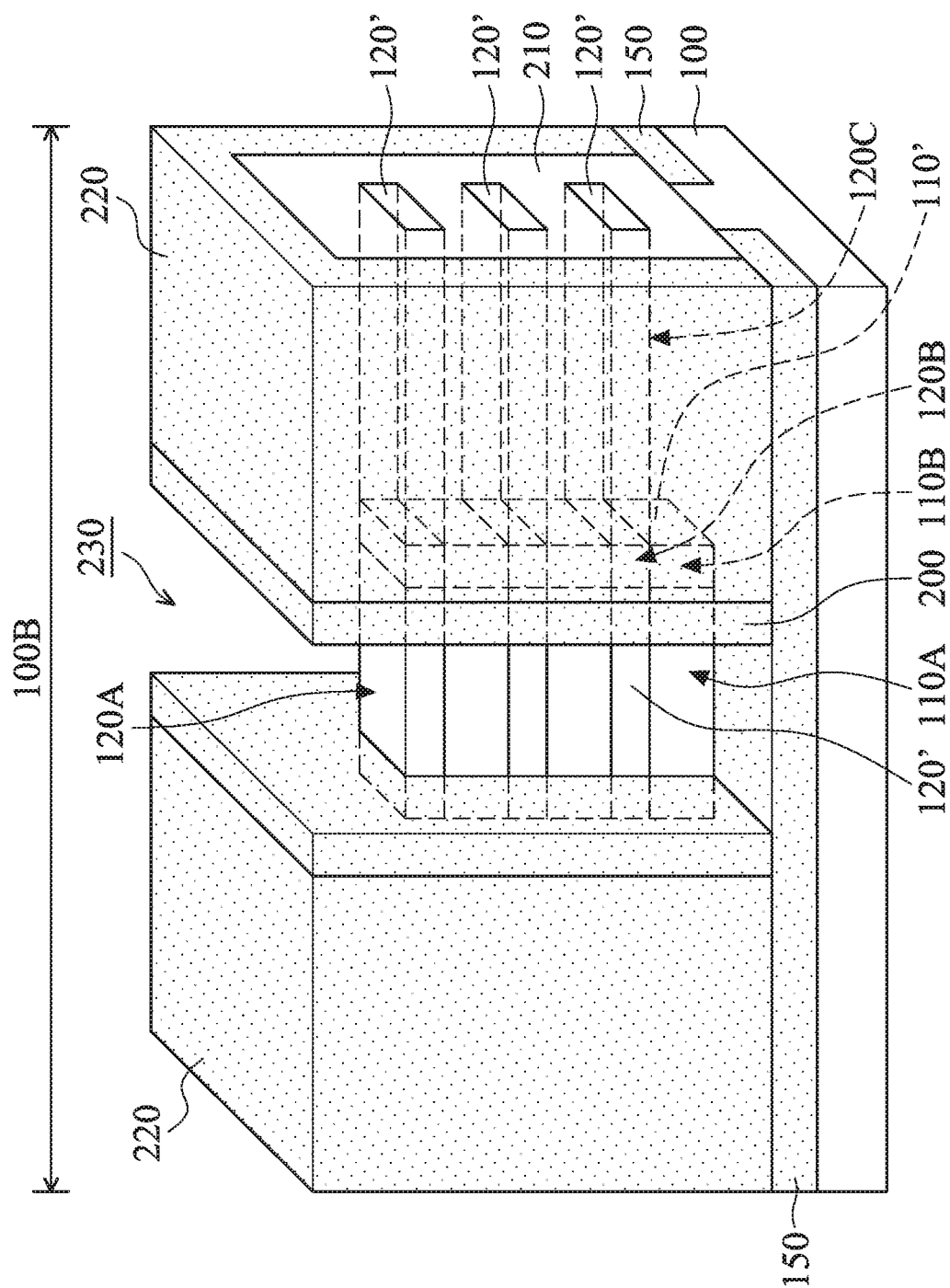

As shown in FIG. 1J, the dummy gate stack 160 in the region 100B is removed, in accordance with some embodiments. As a result, a recess 230 is formed over the semiconductor substrate 100 in the region 100B. In some embodiments, the portions 110A of the semiconductor wires 110' and the portions 120A of the semiconductor wires 120' are exposed from the recess 230, as shown in FIG. 1J. The portions 110B of the semiconductor wires 110' and the portions 120B of the semiconductor wires 120' remain covered by the spacer elements 200, as shown in FIG. 1J.

Figure 1K:
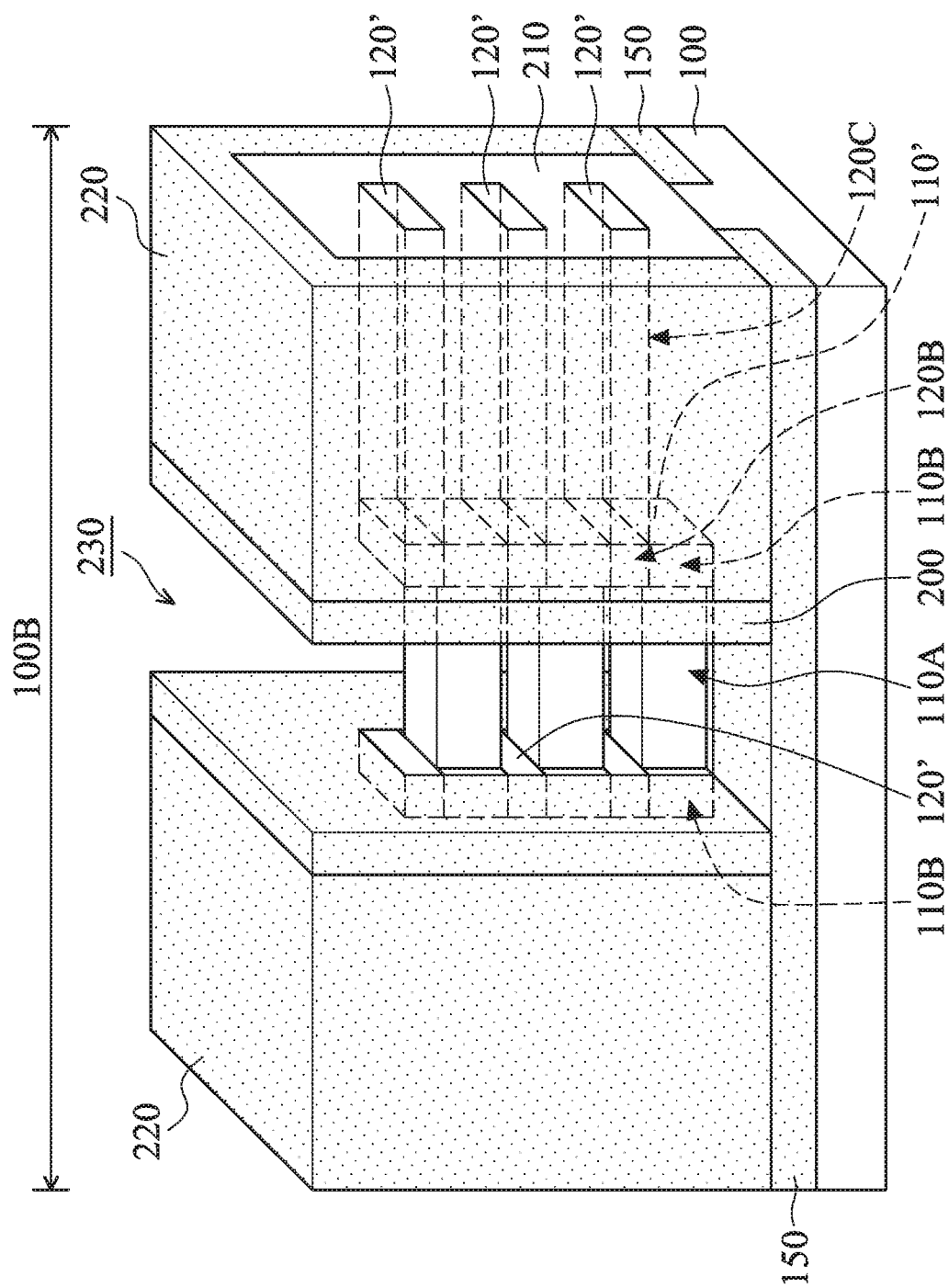

As shown in FIG. 1K, the portions 120A of the semiconductor wires 120' are removed, in accordance with some embodiments. As a result, the portions 110A of the semiconductor wires 110' suspend between the spacer elements 200. The portions 110A serve as channel regions of FETs in the region 100B.

In some embodiments, the portions 110A have a rectangular cross-sectional profile. The corners and/or edges of the portions 110A may be relatively rounded. In some other embodiments, the portions 110A have an oval cross-sectional profile. In some embodiments, the cross-sectional profile of the portions 110A is not square or circular.

The portions 120B of the semiconductor wires 120' remain covered by the spacer elements 200, as shown in FIG. 1K. The portions 110A are separated from one another by an interval that is substantially equal to the thickness $T_2$ of the portions 120B. The interval between the portions 110A is different from the thickness $T_1$ of the portions 110A. In some embodiments, the interval between the portions 110A is less than the thickness $T_1$. The interval between the portions 110A is different from the interval between the portions 120A.

In some embodiments, an etching process is performed to selectively remove the portions 120A of the semiconductor wires 120' without removing the portions 110A of the semiconductor wires 110'. In some embodiments, the etchant used in the etching process includes $NH_4OH$, APM, TMAH, $CF_4$, $SF_6$, $CH_3F$, another suitable solution or gas, or a combination thereof. During the etching operations, the composition of the etchant may be varied according to requirements. In some embodiments, the etchant has a sufficiently high etch selectivity of the semiconductor wires 120' to the semiconductor wires 110'. As a result, the semiconductor wires 120' are etched faster than the semiconductor wires 110'.

The etchant used during the stages shown in FIG. 1K is different from that used during the stages shown in FIG. 1H. In some embodiments, an etchant for removing the portions 110A and another etchant for removing the portions 120A have different etch selectivity. For example, the etchant for removing the portions 120A has a lower etch selectivity than the etchant for removing the portions 110A. As a result, as shown in FIG. 1K, the portions 110A are partially removed and become smaller during the removal of the portions 120A due to the loading effect of the selective etching processes. On the other hand, the portions 120A remain substantially the same size during the removal of the portions 110A, as shown in FIG. 1H.

Figure 1L:
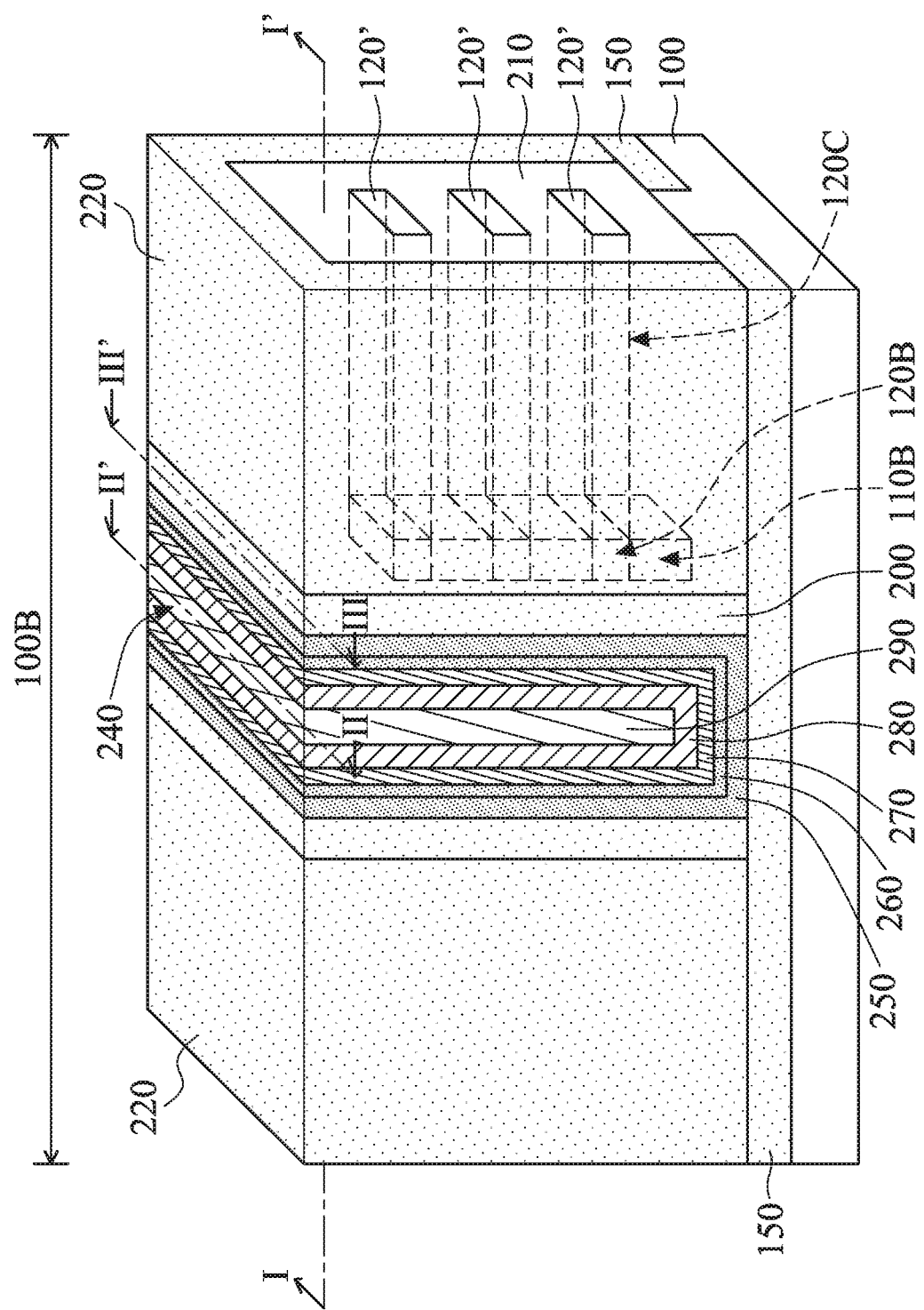
Figures 1, 1L:
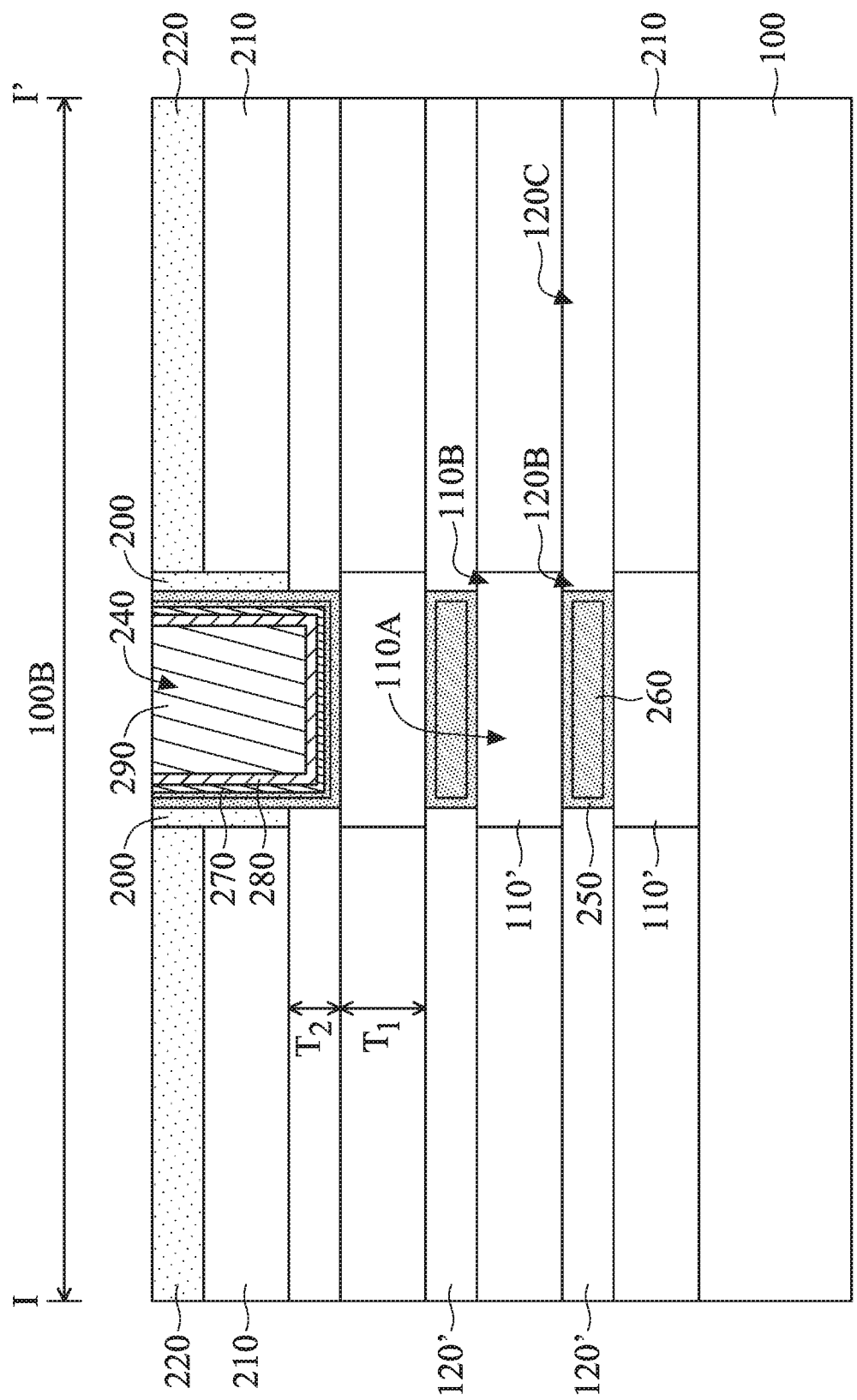
Figures 1, 1L, 2:
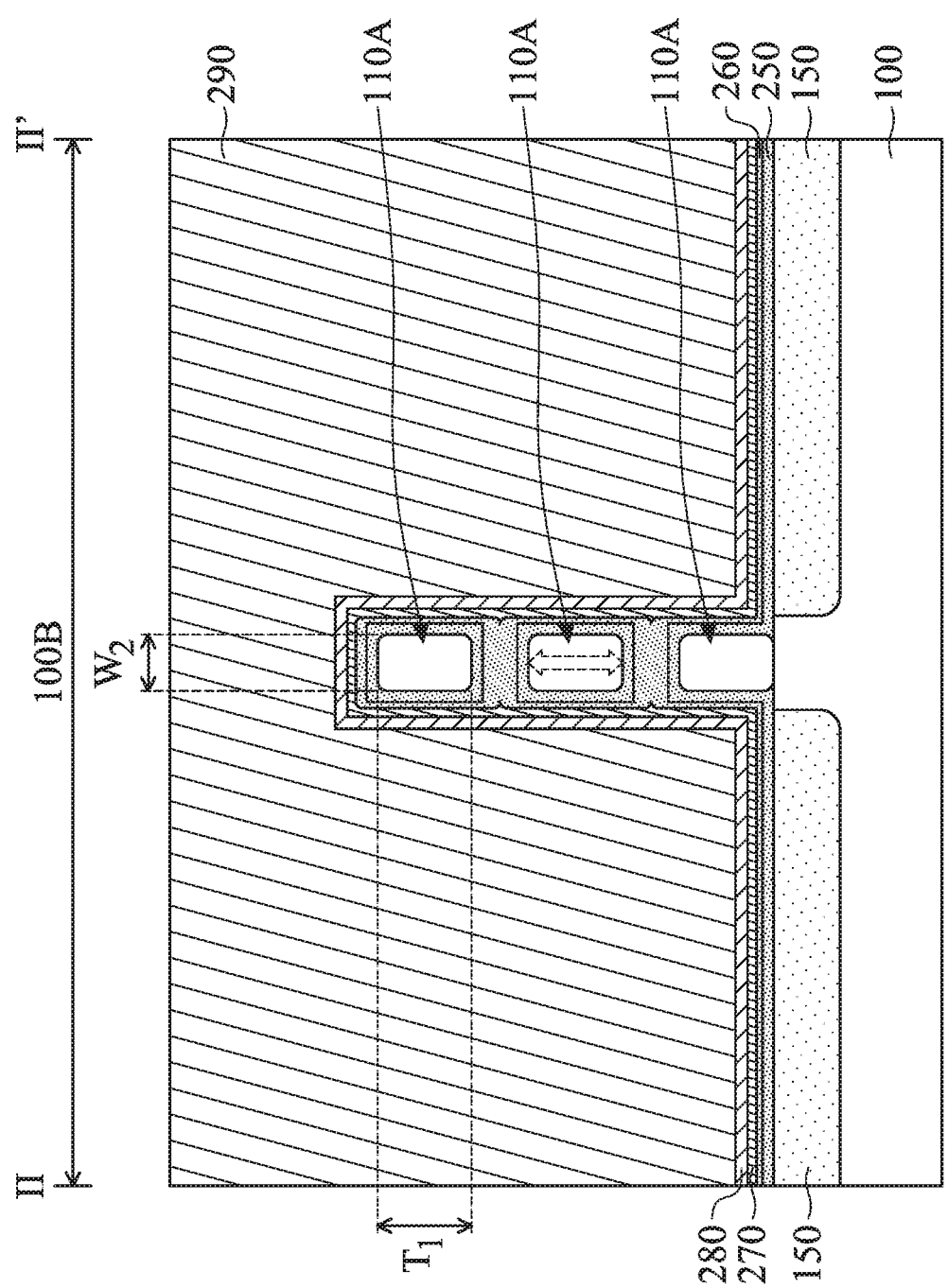
Figures 1, 1L, 2, 3:
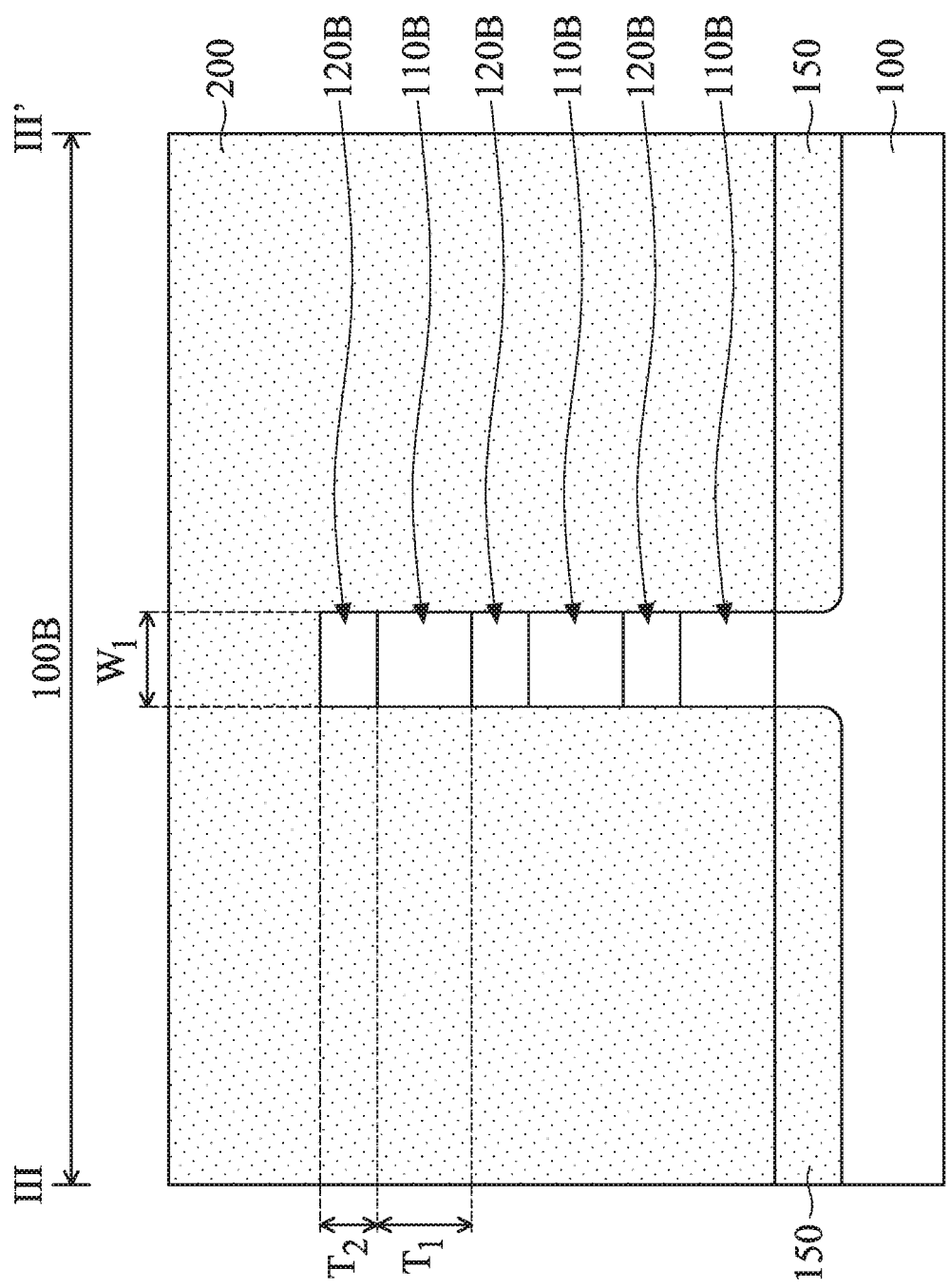

As shown in FIG. 1L, a metal gate stack 240 is formed in the recess 230 in the region 100B, in accordance with some embodiments. The metal gate stack 240 encircles the portions 110A of the semiconductor wires 110'. For illustration purposes, the portions 110A covered by the metal gate stack 240 are not shown in FIG. 1L. In some embodiments, since the portions 110A are partially removed after the removal of the portions 120A, the metal gate stack 240 is in direct contact with both the portions 110A and the portions 110B, as shown in FIGS. 1K and 1L.

As shown in FIG. 1L, the metal gate stack 240 includes an interfacial layer 250, a gate dielectric layer 260, and metal gate stacking layers 270, 280 and 290, in accordance with some embodiments. The materials and/or formation methods of the metal gate stack 240 in the region 100B are the same as or similar to those of the metal gate stack 240 in the region 100A, and are therefore not repeated. The metal gate stack 240 in the region 100B may include different work function layers than the metal gate stack 240 in the region 100A to adjust the work function level. For example, the work function layer in the region 100A may be an N-type metal layer so as to form an N-type transistor while the work function layer in the region 100B may be a P-type metal layer so as to form a P-type transistor.

FIG. 1L-1 is a cross-sectional view of the semiconductor device structure taken along a sectional line I-I' shown in FIG. 1L, in accordance with some embodiments. FIG. 1L-2 is a cross-sectional view of the semiconductor device structure taken along a sectional line II-II' shown in FIG. 1L, in accordance with some embodiments. FIG. 1L-3 is a cross-sectional view of the semiconductor device structure taken along a sectional line III-III' shown in FIG. 1L, in accordance with some embodiments.

As shown in FIG. 1L-1, the portions 110A of the semiconductor wires 110' are surrounded by the metal gate stack 240 in the region 100B, in accordance with some embodiments. In some embodiments, the portions 110A of the semiconductor wires 110' and the portions 120A of the semiconductor wires 120' have substantially the same length but different thicknesses, as shown in FIGS. 1I-1 and 1L-1. The portions 110B of the semiconductor wires 110' are vertically sandwiched between the portions 120B of the semiconductor wires 120'. The portions 120C of the semiconductor wires 120' are surrounded by the source or drain structures 210.

As shown in FIG. 1L-2, the portions 110A of the semiconductor wires 110' are embedded in the metal gate stack 240 in the region 100B, in accordance with some embodiments. In some embodiments, the interfacial layer 250 and the gate dielectric layer 260 are between two of the portions 110A. None of the metal gate stacking layers 270, 280 and 290 is between two of the portions 110A.

The space between the portions 110A is not large, so only a part of the metal gate stack 240 is formed between the portions 110A, as shown in FIGS. 1L-1 and 1L-2. There is substantially no work function layer between the portions 110A. The metal gate stacking layers 270, 280 and 290 cover side surfaces of the portions 110A without covering both top and bottom surfaces of the portions 110A. The uniform work function level from side surfaces results in uniform threshold voltage. Therefore, the device performance of the semiconductor device structure at on-state is improved and current leakage at off-state is avoided. The control of threshold voltage is enhanced.

In some embodiments, the portions 110A have a decreased width $W_2$ that is less than the original width $W_1$. The width $W_2$ is along the [100] crystalline direction. In some embodiments, the width $W_2$ is in a range from about 4 nm to about 6 nm. In some embodiments, the width $W_2$ is less than the thickness $T_1$ of the portions 110A. In some embodiments, a ratio of the thickness $T_1$ to the width $W_2$ is in a range from about 1.2 to about 1.5. In some embodiments, the width $W_2$ is substantially equal to the thickness $T_2$ of the semiconductor wires 120'. The width $W_2$ may be less or greater than the thickness $T_2$. The thickness $T_2$ is along the [110] crystalline direction.

In some embodiments, the portions 110A shown in FIG. 1L-2 have substantially the same perimeter as the portions 120A shown in FIG. 1I-2. In some embodiments, the portions 110A shown in FIG. 1L-2 have substantially the same area as the portions 120A shown in FIG. 1I-2. The area is a cross-sectional area taken along the sectional line II-II' shown in FIGS. 1I and 1L.

In accordance with some embodiments, the thickness $T_1$ of the portions 110A is greater than the width $W_2$ of the portions 110A, as shown in FIG. 1L-2. The mobility of holes in the portions 110A (such as silicon germanium) is large or the maximum in the (110) crystalline plane and in the [110] crystalline direction, as indicated by the dashed arrow in FIG. 1L-2. The thickness $T_1$ is along the [110] crystalline direction. As a result, the effective area of channel regions or $W_{eff}$ of the transistor in the region 100B is greatly increased. The operation speed of the transistor in the region 100B can be improved. Furthermore, the width $W_2$ of the portions 110A is less than the original width $W_1$ of the portions 110A. Drain-induced barrier lowing (DIBL) effect and/or reduction of subthreshold swing are prevented. The short channel effect can be controlled. Accordingly, the device performance of the semiconductor device structure is significantly enhanced.

The mobility of electrons in the material of the portions 120A may be greater than the mobility of holes in the material of the portions 110A. The semiconductor device structure with a fixed total thickness of the semiconductor wires 110' and 120' sacrifices the area of the portions 120A to expand the area of the portions 110A. As a result, the mobility of holes in the portions 110A is improved. The semiconductor device structure has better-balanced performance among its different transistors or can meet various performance requirements for the different transistors.

As shown in FIG. 1L-3, the vertically stacked portions 110B and 120B are covered by the spacer elements 200 in the region 100B, in accordance with some embodiments. In some embodiments, the structure shown in FIG. 1L-3 is substantially the same as that shown in FIG. 1I-3, and are therefore not repeated. The portions 110B shown in FIG. 1L-3 have a larger area than the portions 110A shown in FIG. 1L-2.

In accordance with some embodiments, the portions 110B surrounded by the spacer elements 200 have a larger area. As a result, parasitic resistance of lightly doped drain ($R_{LDD}$) in the region 100B is greatly reduced. On the other hand, dopants in the portions 120B (such as phosphorus in silicon) may diffuse faster than dopants in the portions 110B (such as boron in silicon germanium). Accordingly, even if the portions 120B have a smaller area than the portions 110B, $R_{LDD}$ in the region 100A is still small. Therefore, the device performance of the semiconductor device structure is improved by enlarging the portions 110B and shrinking the portions 120B. The semiconductor device structure remains at a smaller size.

Figure 2A:
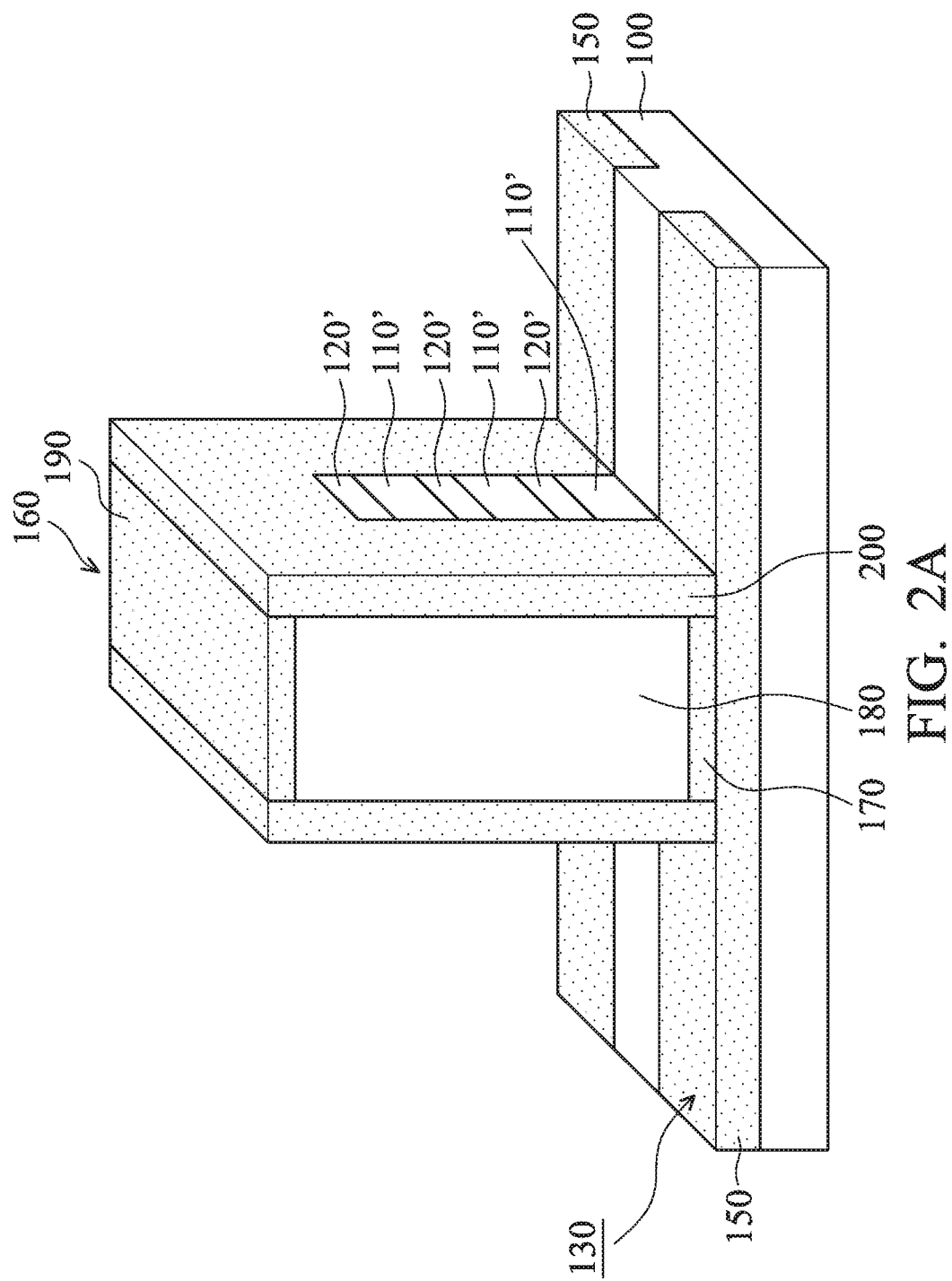
FIGS. 2A-2B are perspective views of various stages of a process for forming a semiconductor device structure, in accordance with some embodiments.
Figure 2B:
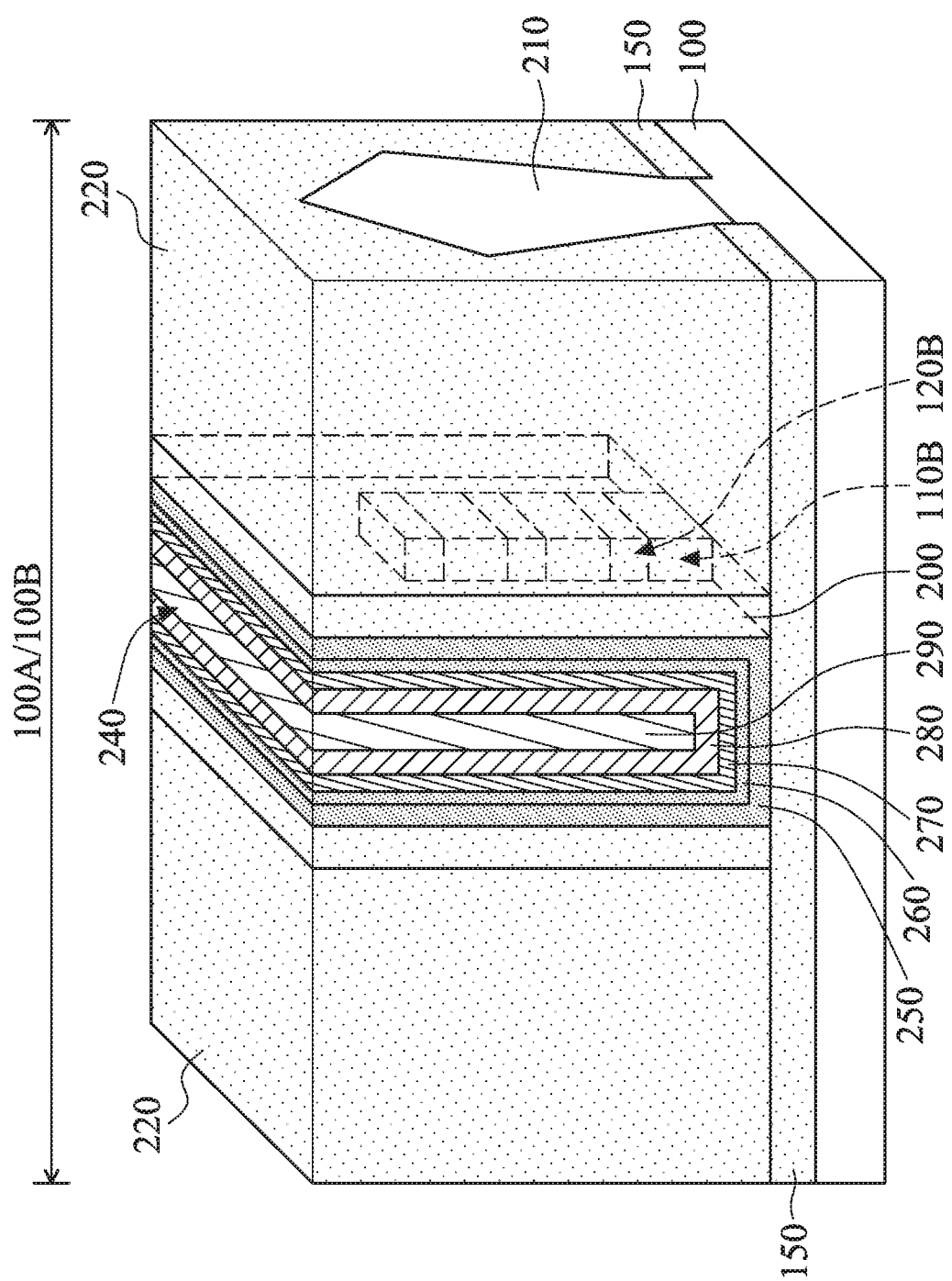

Many variations and/or modifications can be made to embodiments of the disclosure. For example, the semiconductor device structure is not limited to including semiconductor wires embedded in source or drain structures. FIGS. 2A and 2B are perspective views of various stages of a process for forming a semiconductor device structure, in accordance with some embodiments. As shown in FIGS. 2A and 2B, semiconductor device structures similar to those shown in FIGS. 1E, 1I and 1L are provided. In some embodiments, the materials, formation methods, and/or benefits illustrated in the aforementioned embodiments can also be applied in the embodiments illustrated in FIGS. 2A and 2B, and are therefore not repeated.

As shown in FIG. 2A, the portions of the semiconductor wires 110' and 120' that are not under the dummy gate stack 160 and the spacer elements 200 are both removed, in accordance with some embodiments. As a result, space is created for the formation of the source or drain structures 210, as shown in FIG. 2B. In some embodiments, the source or drain structures 210 is in direct contact with the semiconductor wires 110' and 120'. In some other embodiments, the source or drain structures 210 are separated from the semiconductor wires 110' and 120' by a liner layer (not shown). The liner layer may serve as an etch stop layer during subsequent etching processes to protect the source or drain structures 210 and reduce parasitic capacitance.

Embodiments of the disclosure are not limited and may be applied to fabrication processes for any suitable technology generation. Various technology generations include a 2 nm node or other suitable nodes beyond the 2 nm node, such as a 20 nm node, a 16 nm node or a 10 nm node.

Embodiments of the disclosure form a semiconductor device structure with GAA transistor structures. The semiconductor device structure is compatible with the general GAA process. Alternately stacked thicker and thinner semiconductor wires result in better and uniform metal-filling during the formation of the metal gate stack. The difficulty to form the metal gate stack in a small space is lowered without enlarging the total thickness of the semiconductor wires. Uniformity of the work function level and threshold voltage can also be achieved.

According to the aforementioned embodiments, the semiconductor device structure has a larger effective area of channel regions in multiple FETs (such as an N-type FET and a P-type FET). The operation speed of the FETs is greatly improved. Accordingly, the device performance of the semiconductor device structure is enhanced even further. The effective area of channel regions in N-type and P-type FETs both become adjustable. The levels of performance of N-type and P-type FETs can be better balanced to meet requirements.

In accordance with some embodiments, a semiconductor device structure is provided. The semiconductor device structure includes first semiconductor wires over a semiconductor substrate. The first semiconductor wires are vertically spaced apart from each other. The semiconductor device structure also includes a gate stack surrounding first portions of the first semiconductor wires. The first portions have a first width. The semiconductor device structure also includes a spacer element surrounding second portions of the first semiconductor wires. The second portions have a second width. In addition, the semiconductor device structure includes a second semiconductor wire between the second portions. The second semiconductor wire has a third width. The third width is substantially equal to the second width and greater than the first width.

In accordance with some embodiments, a semiconductor device structure is provided. The semiconductor device structure includes first semiconductor wires over a semiconductor substrate. The first semiconductor wires are vertically spaced apart from each other. The semiconductor device structure also includes a gate stack surrounding first portions of the first semiconductor wires. The first portions have a first width and a first thickness to define a first cross-sectional area. The semiconductor device structure also includes a spacer element surrounding second portions of the first semiconductor wires. The second portions have a second width and a second thickness to define a second cross-sectional area. In addition, the semiconductor device structure also includes a second semiconductor wire between the second portions. The second semiconductor wire has a third width and a third thickness to define a third cross-sectional area. The third width is substantially equal to the second width and greater than the first width. The first cross-sectional area, the second cross-sectional area, and the third cross-sectional area are different from each other.

In accordance with some embodiments, a semiconductor device structure is provided. The semiconductor device structure includes first semiconductor wires over a semiconductor substrate and vertically spaced apart from each other. Each of the first semiconductor wires includes a first portion surrounded by a first gate stack, and a second portion surrounded by a first spacer element. The semiconductor device structure also includes a second semiconductor wire between the second portions of the first semiconductor wires. The second semiconductor wire has a first width that is greater than a second width of the first portions of the first semiconductor wires and substantially equal to a third width of the second portions of the first semiconductor wires. The semiconductor device structure also includes third semiconductor wires over a semiconductor substrate and vertically spaced apart from each other, wherein each of the third semiconductor wires includes a first portion surrounded by a second gate stack, and a second portion surrounded by a second spacer element. The semiconductor device structure also includes a fourth semiconductor wire between the second portions of the third semiconductor wires. The fourth semiconductor wire has a fourth width that is substantially equal to a fifth width of the first portions of the third semiconductor wires and a sixth width of the second portions of the third semiconductor wires.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   first semiconductor wires over a semiconductor substrate, wherein the first semiconductor wires are vertically spaced apart from each other;
   a gate stack surrounding first portions of the first semiconductor wires, wherein the first portions have a first width;
   a spacer element surrounding second portions of the first semiconductor wires, wherein the second portions have a second width;
   a second semiconductor wire between the second portions, wherein the second semiconductor wire has a third width, and wherein the third width is substantially equal to the second width and greater than the first width, and
   source or drain structures formed adjacent to the gate stack, wherein a portion of the second semiconductor wire is embedded in the source or drain structures.

2. The semiconductor device structure as claimed in claim 1, wherein the first semiconductor wires and the second semiconductor wire comprise different materials.

3. The semiconductor device structure as claimed in claim 1, wherein an interval between the first semiconductor wires is less than a thickness of the first semiconductor wires.

4. The semiconductor device structure as claimed in claim 1, wherein a first cross-sectional area of the first portions of the first semiconductor wires is less than a second cross-sectional area of the second portions of the first semiconductor wires.

5. The semiconductor device structure as claimed in claim 4, wherein a third cross-sectional area of the second semiconductor wire is less than the second cross-sectional area.

6. The semiconductor device structure as claimed in claim 1, wherein the gate stack is in contact with the first portions and the second portions of the first semiconductor wires.

7. The semiconductor device structure as claimed in claim 1, wherein the gate stack comprises an interfacial layer, a gate dielectric layer, and metal gate stacking layers, and wherein the interfacial layer and the gate dielectric layer fill up a space between the first semiconductor wires.

8. The semiconductor device structure as claimed in claim 7, wherein the metal gate stacking layers do not extend into the space between the first semiconductor wires.

9. A semiconductor device structure, comprising:
   first semiconductor wires over a semiconductor substrate, wherein the first semiconductor wires are vertically spaced apart from each other;
   a gate stack surrounding first portions of the first semiconductor wires, wherein the first portions have a first width and a first thickness to define a first cross-sectional area;
   a spacer element surrounding second portions of the first semiconductor wires, wherein the second portions have a second width and a second thickness to define a second cross-sectional area;
   a second semiconductor wire between the second portions, wherein the second semiconductor wire has a third width and a third thickness to define a third cross-sectional area, wherein the third width is substantially equal to the second width and greater than the first width, and wherein the first cross-sectional area, the second cross-sectional area, and the third cross-sectional area are different from each other; and
   a dielectric layer formed adjacent to the gate stack, wherein a portion of the second semiconductor wire is directly below a dielectric layer.

10. The semiconductor device structure as claimed in claim 9, wherein the first semiconductor wires and the second semiconductor wire comprise different materials.

11. The semiconductor device structure as claimed in claim 9, wherein an interval between the first semiconductor wires is less than the first thickness.

12. The semiconductor device structure as claimed in claim 9, wherein the third thickness is less than the first thickness.

13. The semiconductor device structure as claimed in claim 9, wherein second thickness is substantially equal to the first thickness.

14. The semiconductor device structure as claimed in claim 9, wherein the first cross-sectional area and the third cross-sectional area are less than the second cross-sectional area.

15. The semiconductor device structure as claimed in claim 9, wherein the gate stack is in contact with the first portions and the second portions of the first semiconductor wires.

16. A semiconductor device structure, comprising:
   first semiconductor wires over a semiconductor substrate and vertically spaced apart from each other, wherein each of the first semiconductor wires comprises a first portion surrounded by a first gate stack, and a second portion surrounded by a first spacer element;
   a second semiconductor wire between the second portions of the first semiconductor wires, wherein the second semiconductor wire has a first width that is greater than a second width of the first portions of the first semiconductor wires and substantially equal to a third width of the second portions of the first semiconductor wires;
   third semiconductor wires over the semiconductor substrate and vertically spaced apart from each other, wherein each of the third semiconductor wires comprises a first portion surrounded by a second gate stack, a second portion surrounded by a second spacer element, and a third portion surrounded by source or drain structures; and a fourth semiconductor wire between the second portions of the third semiconductor wires, wherein the fourth semiconductor wire has a fourth width that is substantially equal to a fifth width of the first portions of the third semiconductor wires and a sixth width of the second portions of the third semiconductor wires.

17. The semiconductor device structure as claimed in claim 16, wherein the first semiconductor wires and the second semiconductor wire comprise different materials, the first semiconductor wires and the fourth semiconductor wire comprise the same material, and the third semiconductor wires and the second semiconductor wire comprise the same material.

18. The semiconductor device structure as claimed in claim 16, wherein an interval between the first semiconductor wires is less than a thickness of the first semiconductor wires, and wherein an interval between the third semiconductor wires is greater than a thickness of the third semiconductor wires.

19. The semiconductor device structure as claimed in claim 16, wherein a first cross-sectional area of the first portions of the first semiconductor wires is less than a second cross-sectional area of the second portions of the first semiconductor wires, and a third cross-sectional area of the second semiconductor wire is less than the second cross-sectional area.

20. The semiconductor device structure as claimed in claim 16, wherein a first cross-sectional area of the first portions of the third semiconductor wires is substantially equal to a second cross-sectional area of the second portions of the first semiconductor wires, and a third cross-sectional area of the fourth semiconductor wire is greater than the first cross-sectional area.

* * * * *